United States Patent
Chou

(10) Patent No.: US 12,232,312 B2
(45) Date of Patent: Feb. 18, 2025

(54) METHOD OF MANUFACTURING SEMICONDUCTOR DEVICE HAVING ACTIVE AREA IN STRIP

(71) Applicant: NANYA TECHNOLOGY CORPORATION, New Taipei (TW)

(72) Inventor: Liang-Pin Chou, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 380 days.

(21) Appl. No.: 17/686,106

(22) Filed: Mar. 3, 2022

(65) Prior Publication Data

US 2023/0284441 A1 Sep. 7, 2023

(51) Int. Cl.
H01L 27/112 (2006.01)
H10B 20/20 (2023.01)
H10B 20/25 (2023.01)

(52) U.S. Cl.
CPC .............. *H10B 20/25* (2023.02); *H10B 20/20* (2023.02)

(58) Field of Classification Search
CPC .... H10B 20/20; H10B 20/25; H01L 21/76224
See application file for complete search history.

(56) References Cited

U.S. PATENT DOCUMENTS

| | | | | |
|---|---|---|---|---|
| 7,572,572 B2 * | 8/2009 | Wells | ................... | H10N 70/066 430/311 |
| 9,123,776 B2 * | 9/2015 | Tsai | ................... | H01L 21/76816 |
| 10,262,862 B1 * | 4/2019 | Shih | ................... | H01L 21/76831 |
| 10,529,570 B1 * | 1/2020 | Shih | ................... | H01L 21/76843 |
| 10,685,845 B2 * | 6/2020 | Shih | ................... | H01L 21/3086 |
| 10,832,964 B1 | 11/2020 | Xie et al. | | |

(Continued)

FOREIGN PATENT DOCUMENTS

CN 1450628 A 10/2003
CN 102738220 A 10/2012
(Continued)

OTHER PUBLICATIONS

U.S. Appl. No. 17/685,520, filed Mar. 3, 2022.

*Primary Examiner* — Jay C Kim
(74) *Attorney, Agent, or Firm* — MUNCY, GEISSLER, OLDS & LOWE, P.C.

(57) ABSTRACT

The present application provides a memory device and a method of manufacturing the memory device. The method includes steps of providing a semiconductor substrate including an active area disposed over or in the semiconductor substrate, a first dielectric layer over the semiconductor substrate, a second dielectric layer over the first dielectric layer, and a patterned photoresist layer over the second dielectric layer; removing first portions of the semiconductor substrate, the first dielectric layer and the second dielectric layer exposed through the patterned photoresist layer to form a trench; removing the patterned photoresist layer; disposing an isolation member within the trench; disposing a sacrificial pillar over the second dielectric layer; disposing a first spacer surrounding the sacrificial pillar; removing the sacrificial pillar; disposing a second spacer surrounding the first spacer; and removing second portions of the first dielectric layer and the second dielectric layer exposed through the second spacer.

16 Claims, 27 Drawing Sheets

(56) References Cited

U.S. PATENT DOCUMENTS

| | | |
|---|---|---|
| 11,211,287 B2 * | 12/2021 | Huang .............. H01L 23/53295 |
| 2005/0186735 A1 | 8/2005 | Lee |
| 2006/0244095 A1 * | 11/2006 | Barry ................ H01L 21/76232 |
| | | 257/E21.549 |
| 2014/0273303 A1 | 9/2014 | Chang et al. |
| 2017/0186844 A1 | 6/2017 | Kim et al. |
| 2018/0040505 A1 | 2/2018 | Gaan et al. |
| 2019/0214391 A1 | 7/2019 | Yoon et al. |
| 2020/0365734 A1 | 11/2020 | Liaw |
| 2021/0066466 A1 | 3/2021 | Kwon et al. |

FOREIGN PATENT DOCUMENTS

| | | |
|---|---|---|
| CN | 109360806 A | 2/2019 |
| CN | 113921459 A | 1/2022 |
| KR | 10-2007-0002563 A | 1/2007 |
| TW | 439194 B | 6/2001 |
| TW | 201601219 A | 1/2016 |
| TW | 202038386 A | 10/2020 |

* cited by examiner

METHOD OF MANUFACTURING SEMICONDUCTOR DEVICE HAVING ACTIVE AREA IN STRIP

TECHNICAL FIELD

The present disclosure relates to a memory device and a manufacturing method thereof, and more particularly, to a semiconductor device including an active area (AA) in a shape of a strip and a manufacturing method of the memory device.

DISCUSSION OF THE BACKGROUND

Nonvolatile memory devices can retain data even when their power supply is cut off. One type of nonvolatile memory device is a one-time-programmable (OTP) memory device. With the OTP memory device, a user can program the OTP memory device only once, and data stored in the OTP memory device cannot be modified. A signal is transmitted to a metallic interconnect disposed above a semiconductive substrate.

However, such routing of the metallic interconnect presents an obstacle to increasing routing density of the memory device. Such routing may induce a narrower process window and may result in misalignment or leakage among the memory cells in the memory device, and therefore limits reduction of minimum feature size. It is therefore desirable to develop improvements that address related manufacturing challenges.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a method of manufacturing a memory device. The method includes steps of providing a semiconductor substrate including an active area disposed over or in the semiconductor substrate, a first dielectric layer over the semiconductor substrate, a second dielectric layer over the first dielectric layer, and a patterned photoresist layer over the second dielectric layer; removing first portions of the semiconductor substrate, the first dielectric layer and the second dielectric layer exposed through the patterned photoresist layer to form a trench; removing the patterned photoresist layer; disposing an isolation member within the trench; disposing a sacrificial pillar over the second dielectric layer; disposing a first spacer surrounding the sacrificial pillar; removing the sacrificial pillar; disposing a second spacer surrounding the first spacer; and removing second portions of the first dielectric layer and the second dielectric layer exposed through the second spacer.

In some embodiments, the method further includes removing the first spacer and the second spacer after the removal of the second portions of the first dielectric layer and the second dielectric layer exposed through the second spacer.

In some embodiments, the sacrificial pillar is removed after the disposing of the first spacer and prior to the disposing of the second spacer.

In some embodiments, the method further includes removing third portions of the semiconductor substrate exposed through the second spacer, the first dielectric layer and the second dielectric layer.

In some embodiments, the sacrificial pillar includes nitride.

In some embodiments, a cross-section of the sacrificial pillar is in a circular shape.

In some embodiments, the first spacer and the second spacer include a same dielectric material.

In some embodiments, the removal of the second portions of the first dielectric layer and the second dielectric layer exposed through the second spacer includes removing fourth portions of the first dielectric layer and the second dielectric layer that appear within the second spacer from a top view, and removing fifth portions of the first dielectric layer and the second dielectric layer that appear outside of the second spacer from the top view.

In some embodiments, the removal of the fourth portions of the first dielectric layer and the second dielectric layer that appear within the second spacer from the top view is performed before or after the removal of the fifth portions of the first dielectric layer and the second dielectric layer that appear outside of the second spacer from the top view.

In some embodiments, the removal of the fourth portions of the first dielectric layer and the second dielectric layer that appear within the second spacer from the top view is performed simultaneously with the removal of the fifth portions of the first dielectric layer and the second dielectric layer that appear outside of the second spacer from the top view.

In some embodiments, the disposing of the second spacer includes forming an opening surrounded by the first spacer and the second spacer.

In some embodiments, the second portions of the first dielectric layer and the second dielectric layer exposed through the second spacer appear at least partially disposed within the opening from the top view.

In some embodiments, the second spacer includes a first annular member in contact with an outer surface of the first spacer, and includes a second annular member in contact with an inner surface of the first spacer.

In some embodiments, the first dielectric layer includes oxide.

In some embodiments, the second dielectric layer includes nitride.

In some embodiments, the isolation member includes oxide.

Another aspect of the present disclosure provides a method of manufacturing a memory device. The method includes steps of providing a semiconductor substrate including an active area disposed over or in the semiconductor substrate; forming an oxide film over the semiconductor substrate; forming a nitride film over the oxide film; form a trench extending through the oxide film and the nitride film; forming a first hollow spacer over the nitride film; forming a second hollow spacer surrounding the first hollow spacer; forming a third hollow spacer surrounded by the first hollow spacer; and removing portions of the oxide film and the nitride film exposed through the second hollow spacer and the third hollow spacer.

In some embodiments, the second hollow spacer surrounds the first hollow spacer and the third hollow spacer.

In some embodiments, the oxide film is formed by oxidizing the semiconductor substrate.

In some embodiments, the nitride film is formed by chemical vapor deposition (CVD).

In some embodiments, the trench is filled by an isolation material.

In some embodiments, the method further includes disposing a photoresist material over the nitride film, and patterning the photoresist material to form a patterned photoresist layer.

In some embodiments, the formation of the trench includes removing the oxide film and the nitride film exposed through the patterned photoresist layer.

In some embodiments, the method further includes forming a sacrificial pillar over the nitride film prior to the formation of the first hollow spacer.

In some embodiments, the first hollow spacer surrounds the sacrificial pillar.

In some embodiments, the method further includes removing the sacrificial pillar after the formation of the first hollow spacer.

In some embodiments, the formation of the second hollow spacer and the formation of the third hollow spacer are performed separately or simultaneously.

In some embodiments, the second hollow spacer and the third hollow spacer include a same dielectric material.

In some embodiments, the method further includes removing portions of the semiconductor substrate exposed through the nitride film to form a hole, and filling the hole with an isolation member.

One aspect of the present disclosure provides a memory device. The memory device includes a semiconductor substrate defined with an active area over or in the semiconductor substrate and including a recess surrounding the active area; a first dielectric layer disposed over the active area of the semiconductor substrate; a second dielectric layer disposed over the first dielectric layer; and an isolation member disposed within the recess and entirely surrounding the active area.

In some embodiments, a top surface of the second dielectric layer is substantially coplanar with a top surface of the isolation member.

In some embodiments, a top surface of the first dielectric layer is substantially lower than a top surface of the isolation member.

In some embodiments, the first dielectric layer and the isolation member include a same material.

In some embodiments, the semiconductor substrate includes silicon.

In some embodiments, the first dielectric layer is integral with the isolation member.

In conclusion, because the active area of the semiconductor substrate is defined by disposing several annular spacers over the semiconductor substrate and removing predetermined portions of the semiconductor substrate exposed through the annular spacers, a size of the active area can be maintained with minimal or no decrease during the removal. Therefore, a process window for subsequent processes over the active area is not further reduced. As a result, misalignment or leakage among the memory cells in the memory device can be prevented or minimized, and an overall performance the memory device can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
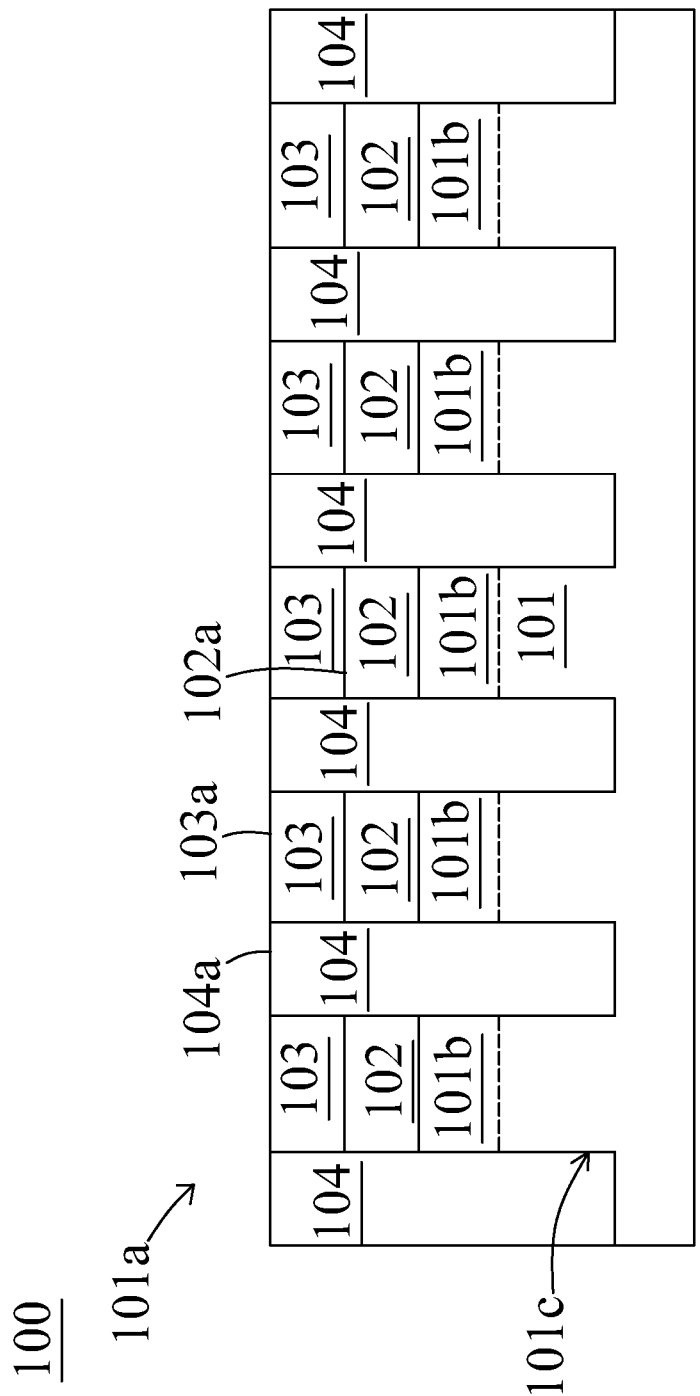
FIG. 1 is a cross-sectional side view of a memory device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
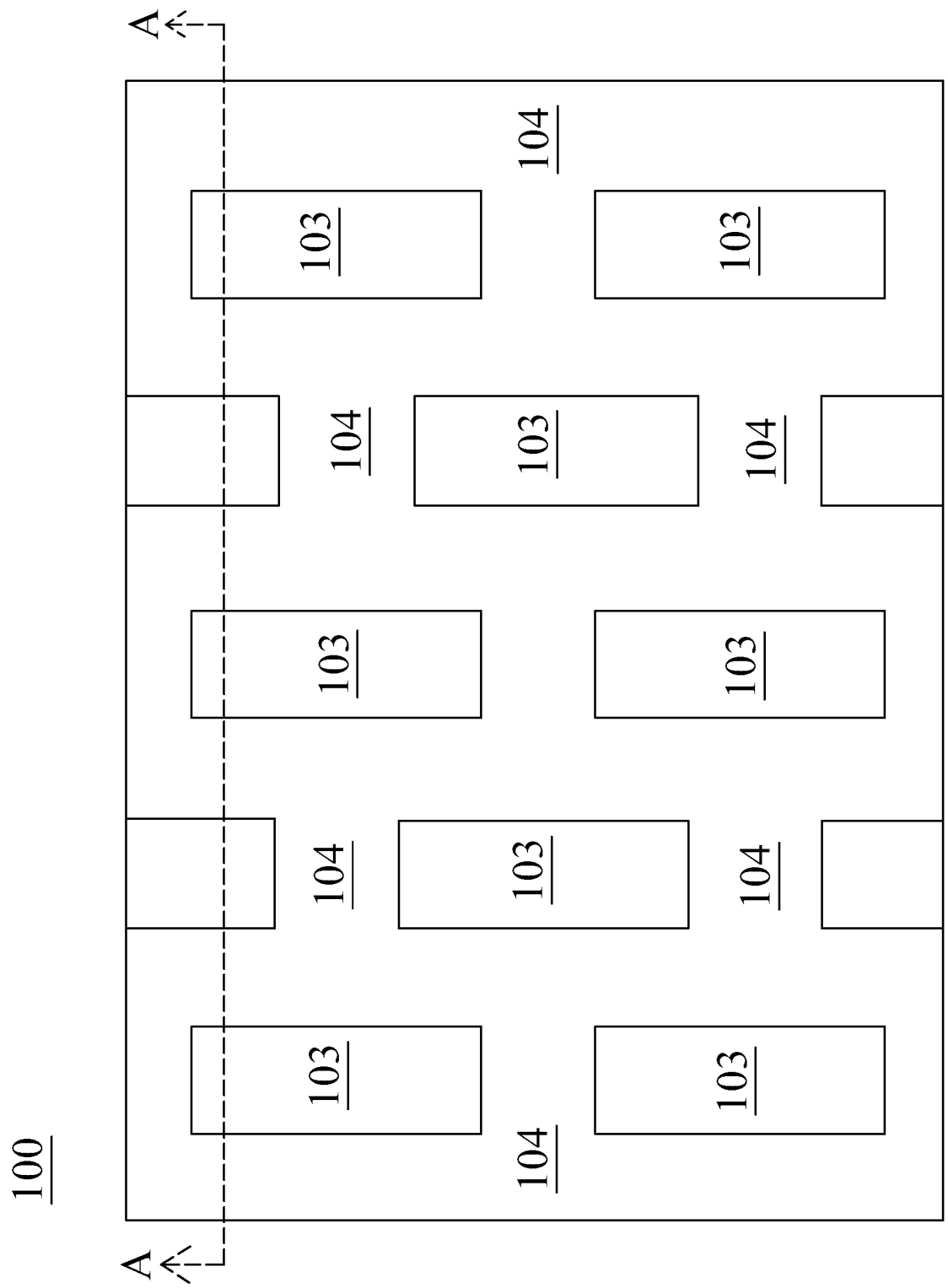
FIG. 2 is a cross-sectional top view of the memory device in FIG. 1.

FIG. 1 is a schematic cross-sectional side view of a memory device 100 in accordance with some embodiments of the present disclosure. FIG. 2 is a schematic cross-sectional top view of the memory device 100 illustrated in FIG. 1. FIG. 1 is the cross-sectional side view along a line AA in FIG. 2. In some embodiments, the memory device 100 as shown in FIG. 1 can be a part of device. In some embodiments, the memory device 100 includes several unit cells arranged along rows and columns.

In some embodiments, the memory device 100 includes a semiconductor substrate 101. In some embodiments, the semiconductor substrate 101 is semiconductive in nature. In some embodiments, the semiconductor substrate 101 is a semiconductor wafer (e.g., a silicon wafer) or a semiconductor-on-insulator (SOI) wafer (e.g., a silicon-on-insulator wafer). In some embodiments, the semiconductor substrate 101 is a silicon substrate.

In some embodiments, the semiconductor substrate 101 is defined with a peripheral region (not shown) and an array region 101a. In some embodiments, the array region 101a is at least partially surrounded by the peripheral region. In some embodiments, the peripheral region is adjacent to a periphery of the semiconductor substrate 101, and the array region 101a is adjacent to a central area of the semiconductor substrate 101. In some embodiments, the array region 101a may be used for fabricating electronic components such as capacitors, transistors or the like. In some embodiments, a boundary is disposed between the peripheral region and the array region 101a.

In some embodiments, the semiconductor substrate 101 includes a recess 101c extending into the semiconductor substrate and surrounding the active area 101b. In some embodiments, the semiconductor substrate 101 includes an active area 101b disposed over or in the semiconductor substrate 101. In some embodiments, the active area 101b is a doped region in the semiconductor substrate 101. In some embodiments, the active area 101b extends horizontally over or under a top surface of the semiconductor substrate 101. In some embodiments, a dimension of a top cross section of each active area 101b can be same as or different from each other.

In some embodiments, each of the active areas 101b includes a same type of dopant. In some embodiments, each of the active areas 101b includes a type of dopant that is different from the types of dopants included in other active areas 101b. In some embodiments, each of the active areas 101b has a same conductive type. In some embodiments, the active area 101b includes N type dopants.

In some embodiments, a first dielectric layer 102 is disposed over the semiconductor substrate 101. In some embodiments, the first dielectric layer 102 is disposed over the active area 101b of the semiconductor substrate 101. In some embodiments, the first dielectric layer 102 includes dielectric material such as oxide, silicon dioxide ($SiO_2$) or the like. In some embodiments, the first dielectric layer 102 is an oxide film. In some embodiments, the first dielectric layer 102 may serve as a gate dielectric or a part of the gate dielectric subsequently formed over the active area 101b of the semiconductor substrate 101.

In some embodiments, a second dielectric layer 103 is disposed over the first dielectric layer 102 and the semiconductor substrate 101. In some embodiments, the second dielectric layer 103 is disposed over the active area 101b of the semiconductor substrate 101. In some embodiments, the second dielectric layer 103 includes nitride, silicon nitride or the like. In some embodiments, the second dielectric layer 103 is a nitride film. In some embodiments, the second dielectric layer 103 may serve as a mask layer for protecting the semiconductor substrate 101. In some embodiments as shown in FIG. 2, the active area 101b covered by the first dielectric layer 102 and the second dielectric layer 103 is in a strip, elongated, rectangular or polygonal shape.

In some embodiments, the memory device 100 includes an isolation member 104 surrounding the active area 101b of the semiconductor substrate 101. In some embodiments, the active area 101b is surrounded by the isolation member 104, such that the active areas 101b are separated and electrically isolated from each other by the isolation member 104. In some embodiments, the active areas 101b are arranged along a column or row direction. In some embodiments, the active area 101b is entirely surrounded by the isolation member 104.

In some embodiments, the isolation member 104 surrounds the first dielectric layer 102 and the second dielectric layer 103 disposed over the active area 101b of the semiconductor substrate 101. In some embodiments, the isolation member 104 is at least partially disposed within the recess 101c of the semiconductor substrate 101. In some embodiments, the isolation member 104 entirely surrounds the active area 101b of the semiconductor substrate 101.

In some embodiments, a top surface 103a of the second dielectric layer 103 is substantially coplanar with a top surface 104a of the isolation member 104. In some embodiments, a top surface 102a of the first dielectric layer 102 is substantially lower than the top surface 104a of the isolation member 104. In some embodiments, a depth of the isolation member 104 is substantially greater than or equal to a depth of the active area 101b. In some embodiments, the isolation member 104 is a shallow trench isolation (STI) or is a part of the STI. In some embodiments, the isolation member 104 defines a boundary of the active area 101b.

In some embodiments, the isolation member 104 is formed of an insulating material, such as silicon oxide, silicon nitride, silicon oxynitride, the like or a combination thereof. In some embodiments, the first dielectric layer 102 and the isolation member 104 include a same material. In some embodiments, the first dielectric layer 102 is integral with the isolation member 104.

Figure 3:
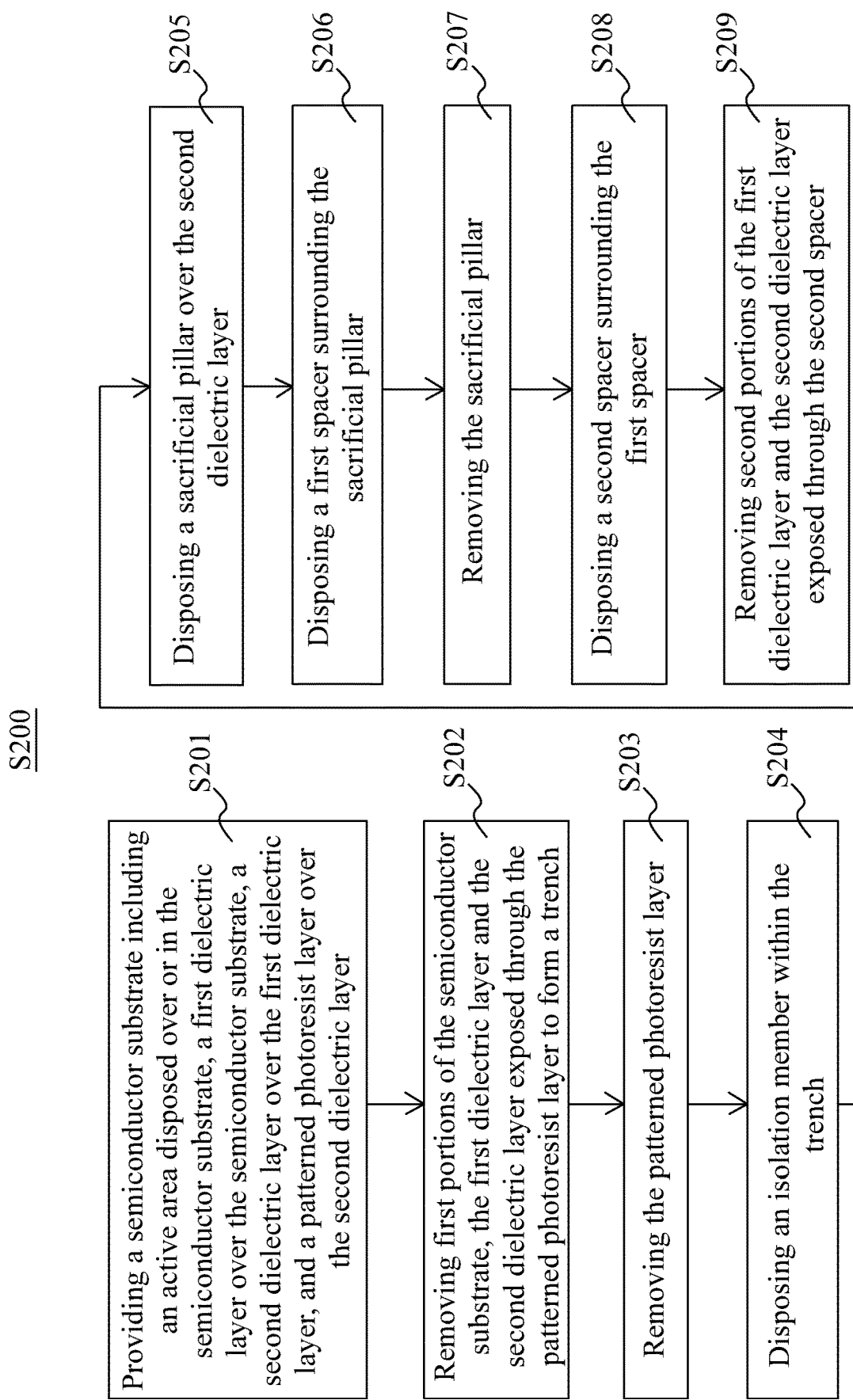
FIG. 3 is a flow diagram illustrating a method of manufacturing a memory device in accordance with some embodiments of the present disclosure.

FIG. 3 is a flow diagram illustrating a method S200 of manufacturing a memory device 100 in accordance with some embodiments of the present disclosure, and FIGS. 4 to 27 are cross-sectional views of intermediate stages in formation of the memory device 100 in accordance with some embodiments of the present disclosure.

The stages shown in FIGS. 4 to 27 are also illustrated schematically in the flow diagram in FIG. 3. In following discussion, the fabrication stages shown in FIGS. 4 to 27 are discussed in reference to process steps shown in FIG. 3. The method S200 includes a number of operations, and description and illustration are not deemed as a limitation to a sequence of the operations. The method S200 includes a number of steps (S201, S202, S203, S204, S205, S206, S207, S208 and S209).

Referring to FIGS. 4 to 8, a semiconductor substrate 101, a first dielectric layer 102 over the semiconductor substrate, a second dielectric layer 103 over the first dielectric layer, and a patterned photoresist layer 105 over the second dielectric layer are provided according to step S201 in FIG. 3.

Figure 4:
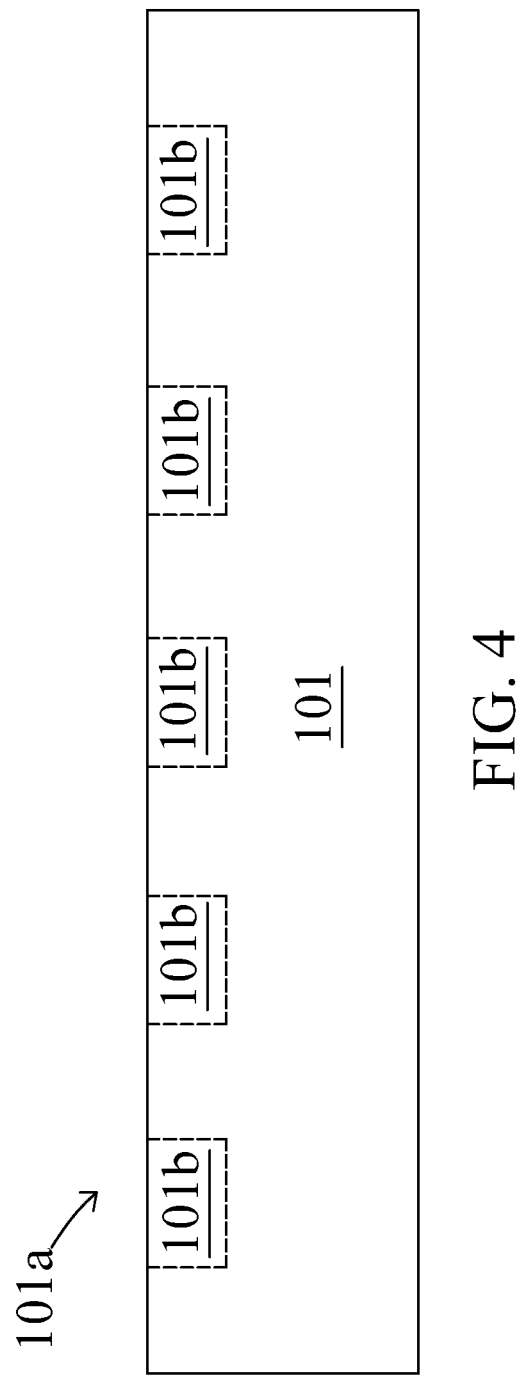
FIGS. 4 to 27 are cross-sectional views of intermediate stages in the formation of a memory device in accordance with some embodiments of the present disclosure.

In some embodiments as shown in FIG. 4, the semiconductor substrate 101 including an active area 101b disposed over or in the semiconductor substrate 101 is provided. In some embodiments, the semiconductor substrate 101 includes semiconductive material. In some embodiments, the semiconductor substrate 101 is a silicon substrate. In some embodiments, the semiconductor substrate 101 is defined with a peripheral region (not shown) and an array region 101a at least partially surrounded by the peripheral region. In some embodiments, the array region 101a is adjacent to a central area of the semiconductor substrate 101.

In some embodiments, the active area 101b is a doped region in the semiconductor substrate 101. In some embodiments, the active area 101b extends horizontally over or under a top surface of the semiconductor substrate 101. In some embodiments, each of the active areas 101b includes a same type of dopant. In some embodiments, each of the active areas 101b includes a type of dopant that is different from types of dopants included in other active areas 101b. In some embodiments, each of the active areas 101b has a same conductive type. In some embodiments, the active area 101b is formed by an ion implantation process or an ion doping process.

Figure 5:
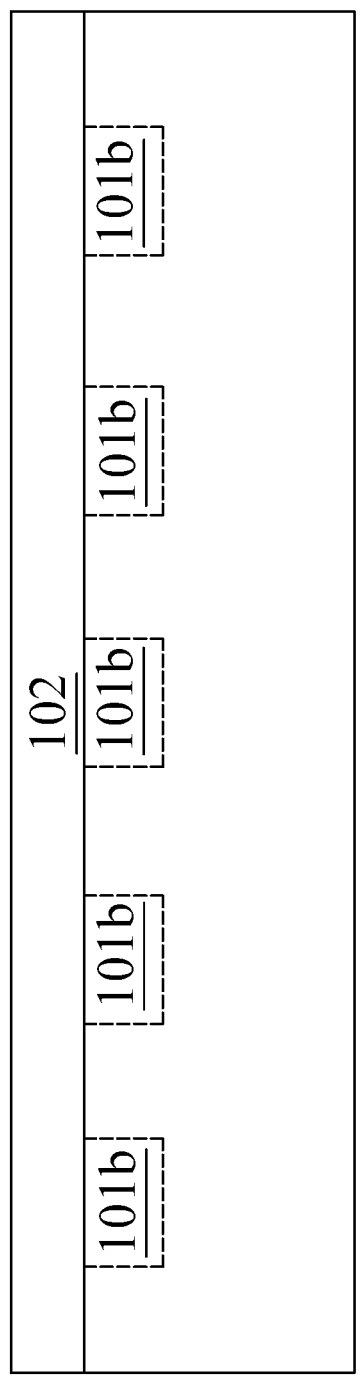

In some embodiments as shown in FIG. 5, the first dielectric layer 102 is formed over the semiconductor substrate 101. In some embodiments, the first dielectric layer 102 is formed over the active area 101b of the semiconductor substrate 101. In some embodiments, the first dielectric layer 102 is formed by oxidizing the semiconductor substrate 101 or a part of the semiconductor substrate 101, deposition or any other suitable process. In some embodiments, the first dielectric layer 102 includes dielectric material such as oxide, silicon dioxide ($SiO_2$) or the like. In some embodiments, the first dielectric layer 102 is an oxide film.

Figure 6:
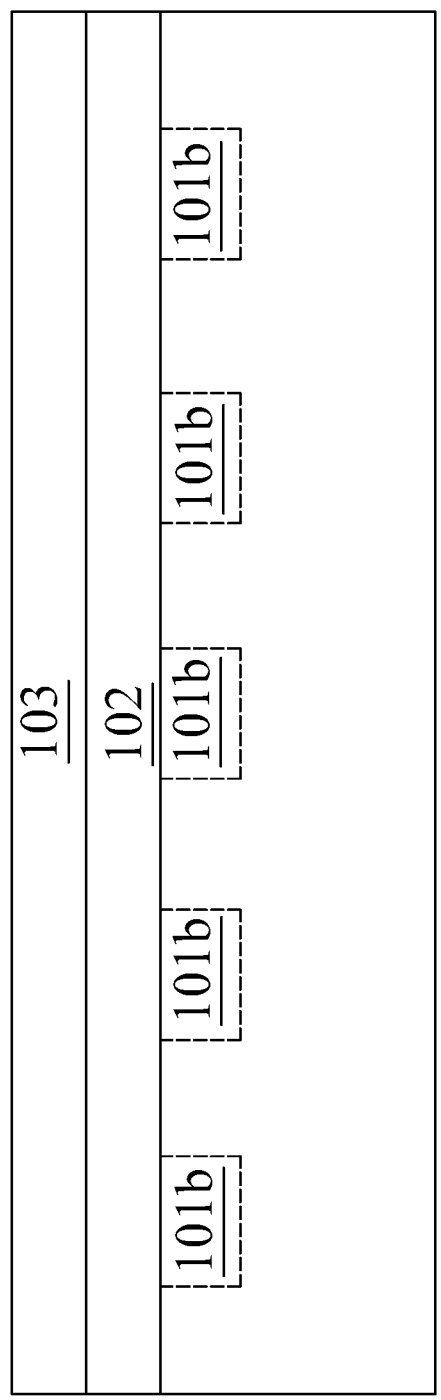

In some embodiments as shown in FIG. 6, the second dielectric layer 103 is formed over the first dielectric layer 102. In some embodiments, the second dielectric layer 103 is disposed over the active area 101b of the semiconductor substrate 101. In some embodiments, the second dielectric layer 103 includes nitride, silicon nitride or the like. In some embodiments, the second dielectric layer 103 is a nitride film. In some embodiments, the second dielectric layer 103 is formed by chemical vapor deposition (CVD), spin coating or any other suitable process.

Figure 7:
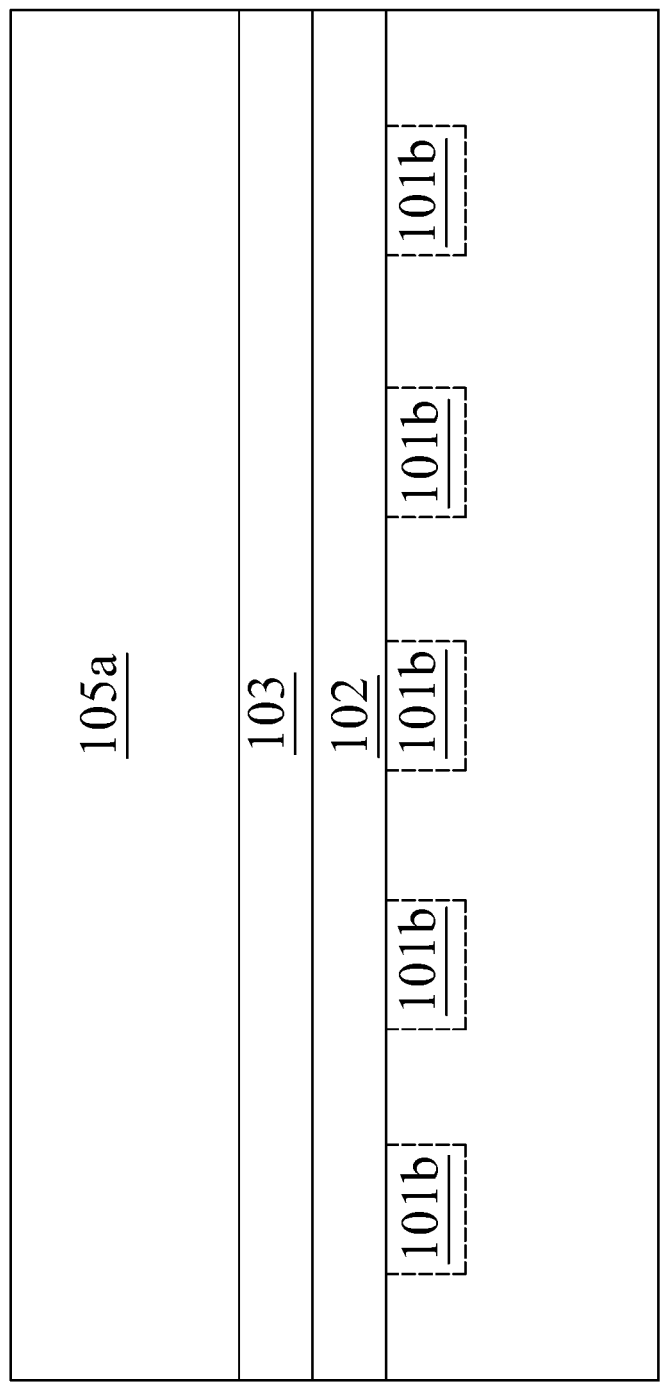
Figure 8:
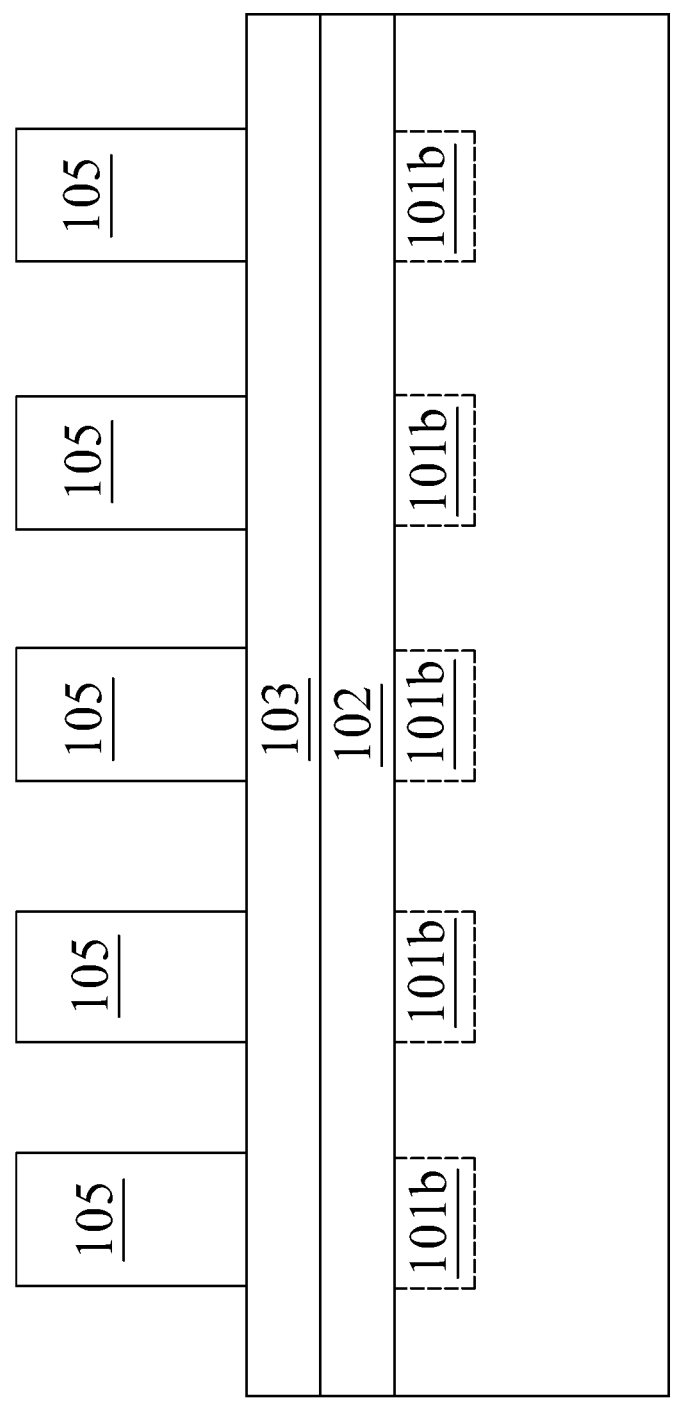

In some embodiments as shown in FIGS. 7 and 8, the patterned photoresist layer 105 is formed over the second dielectric layer 103. In some embodiments, the patterned photoresist layer 105 is formed by disposing a photoresist material 105a over the second dielectric layer 103 as shown in FIG. 7, and patterning the photoresist material 105a as shown in FIG. 8. The patterning of the photoresist material 105a includes removing portions of the photoresist material 105a by etching or any other suitable process. As shown in FIG. 8, the second dielectric layer 103 is at least partially exposed through the patterned photoresist layer 105.

Figure 9:
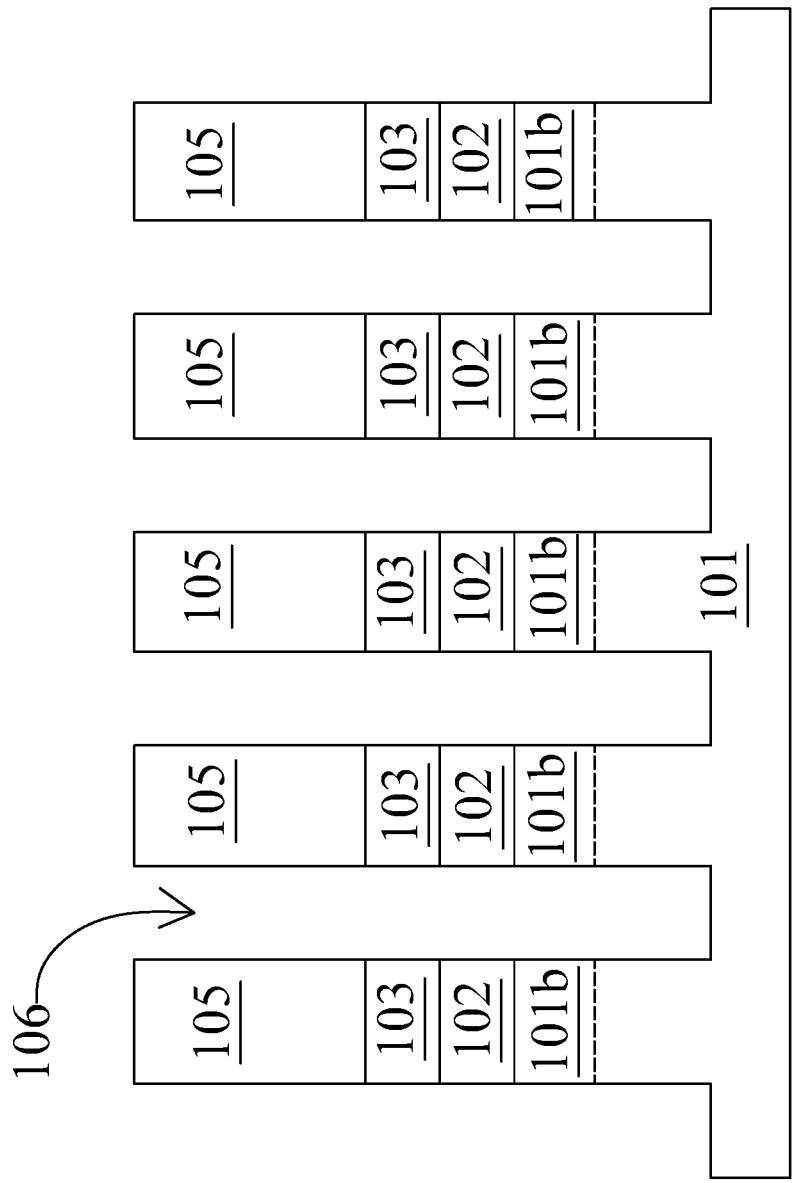
Figure 10:
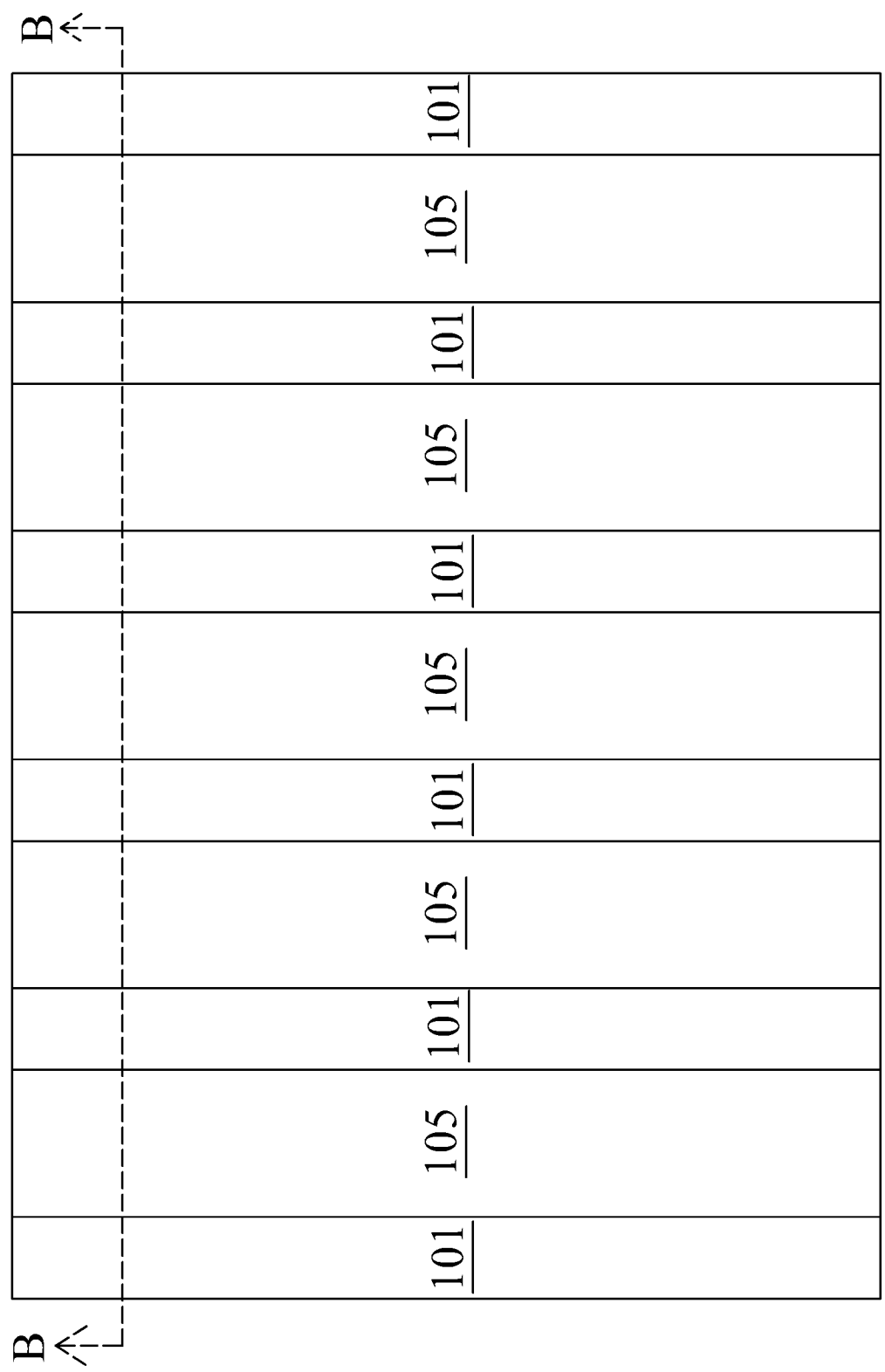

Referring to FIGS. 9 and 10, first portions of the semiconductor substrate 101, the first dielectric layer 102 and the second dielectric layer 103 exposed through the patterned photoresist layer 105 are removed to form a trench 106 according to step S202 in FIG. 3. FIG. 10 is a top view of FIG. 9. FIG. 9 is the cross-sectional side view along a line BB in FIG. 10. The trench 106 extends through the first dielectric layer 102 and the second dielectric layer 103. In some embodiments, the first portions of the semiconductor substrate 101, the first dielectric layer 102 and the second dielectric layer 103 exposed through the patterned photoresist layer 105 are removed by etching or any other suitable process. In some embodiments, a strip pattern as seen in a top view of FIG. 9 is formed after the formation of the trench 106 as shown in FIG. 10.

Figure 11:
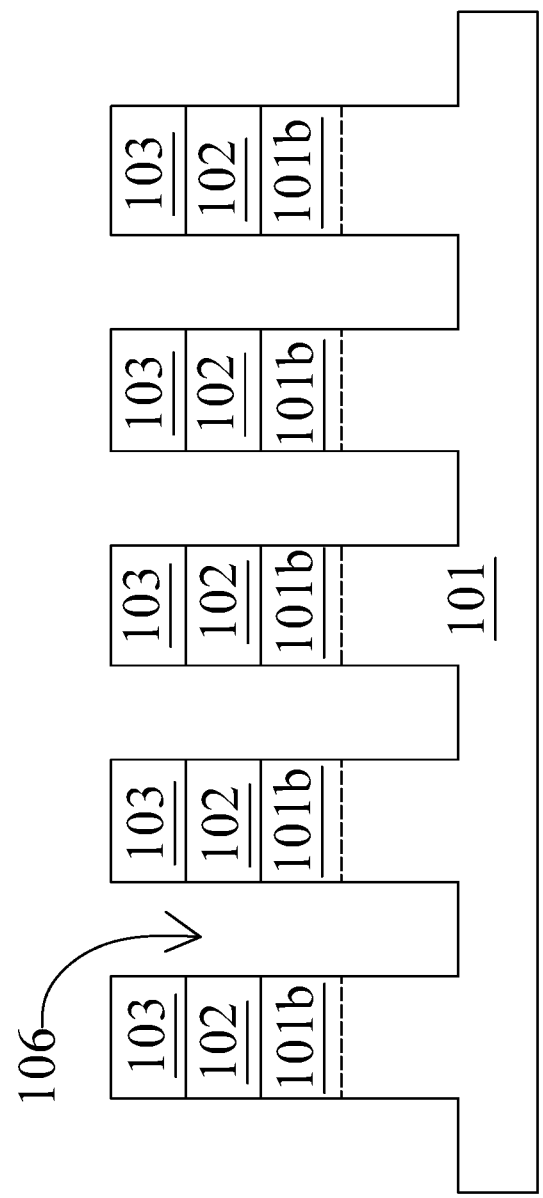
Figure 12:
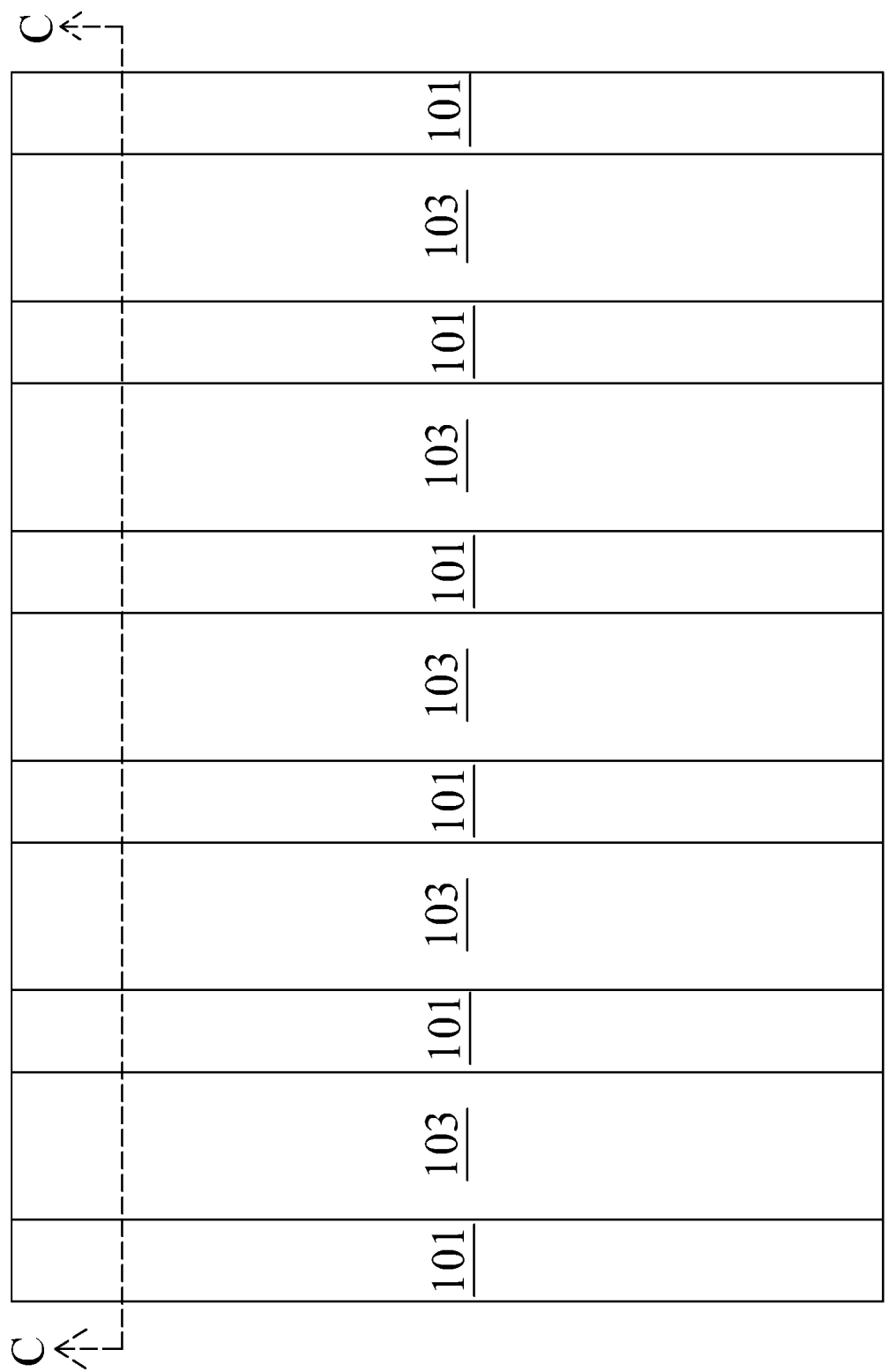

Referring to FIGS. 11 and 12, the patterned photoresist layer 105 is removed according to step S203 in FIG. 3. FIG. 12 is a top view of FIG. 11. FIG. 11 is the cross-sectional side view along a line CC in FIG. 12. In some embodiments, the patterned photoresist layer 105 is removed by etching, stripping or any other suitable process. As shown in FIG. 12, the second dielectric layer 103 is exposed after the removal of the patterned photoresist layer 105.

Figure 13:
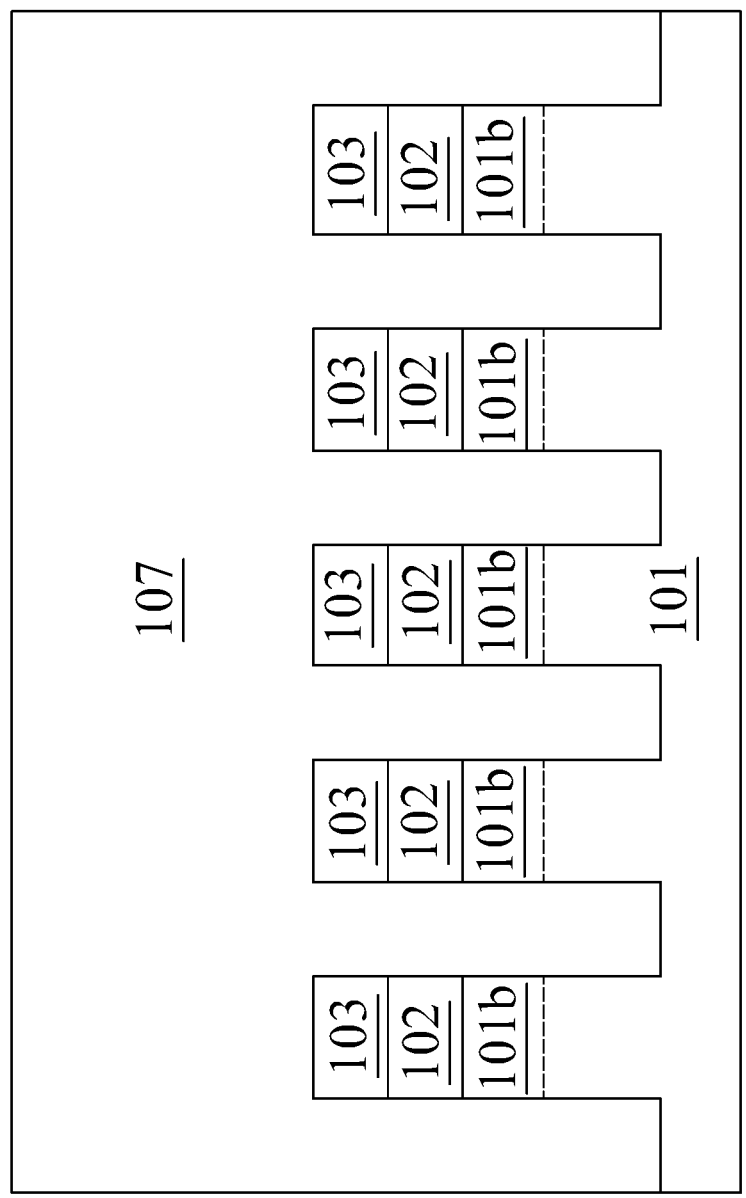
Figure 14:
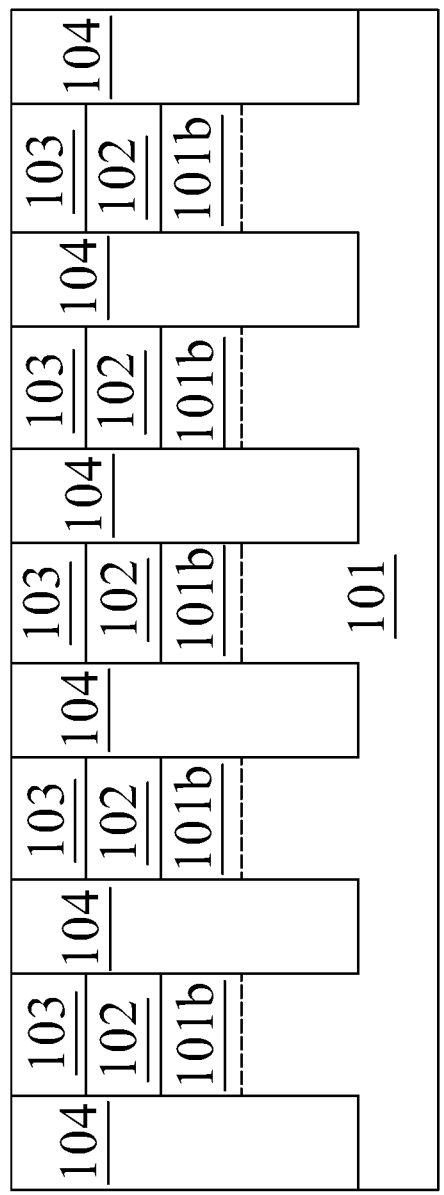
Figure 15:

Referring to FIGS. 13 to 15, an isolation member 104 is disposed within the trench 106 according to step S204 in FIG. 3. FIG. 15 is a top view of FIG. 14. FIG. 14 is the cross-sectional side view along a line DD in FIG. 15. In some embodiments, the isolation member 104 is formed by disposing an isolation material 107 over the semiconductor substrate 101 and the second dielectric layer 103 as shown in FIG. 13, and then removing portions of the isolation material 107 to form the isolation member 104 as shown in FIG. 14. In some embodiments, the trench 106 is filled by the isolation material 107. In some embodiments, the portions of the isolation material 107 are removed by planarization, etching or any other suitable process. In some embodiments, the isolation member 104 surrounds the first dielectric layer 102 and the second dielectric layer 103 disposed over the active area 101b of the semiconductor substrate 101. In some embodiments, the isolation member 104 includes oxide.

Figure 16:
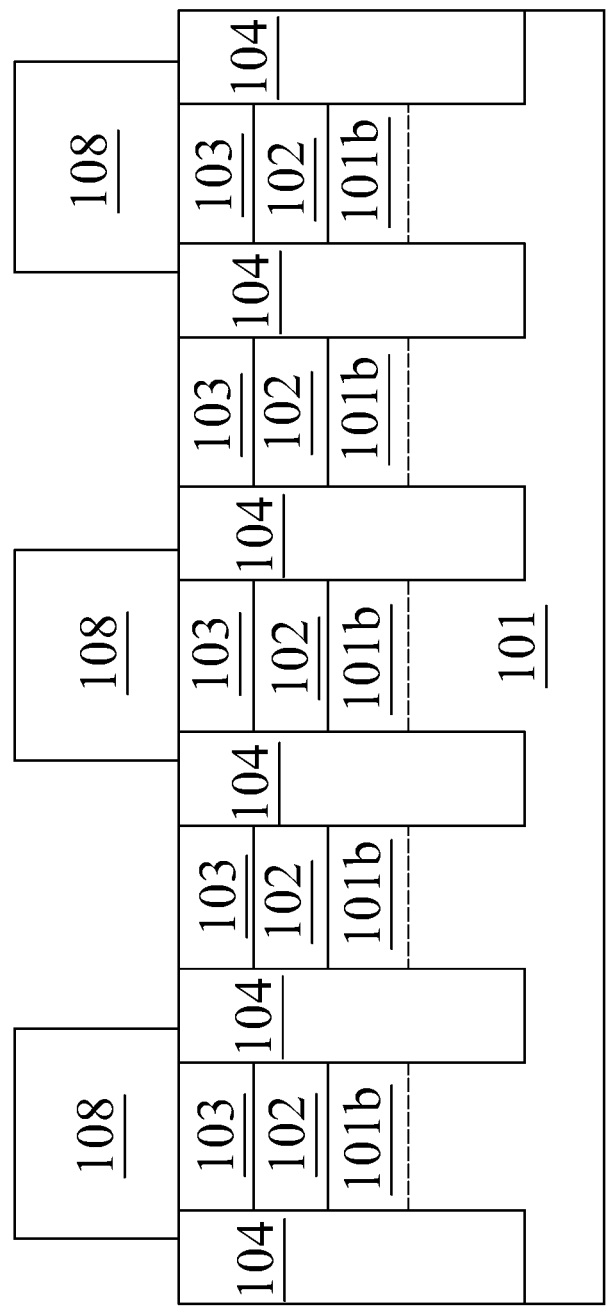
Figure 17:
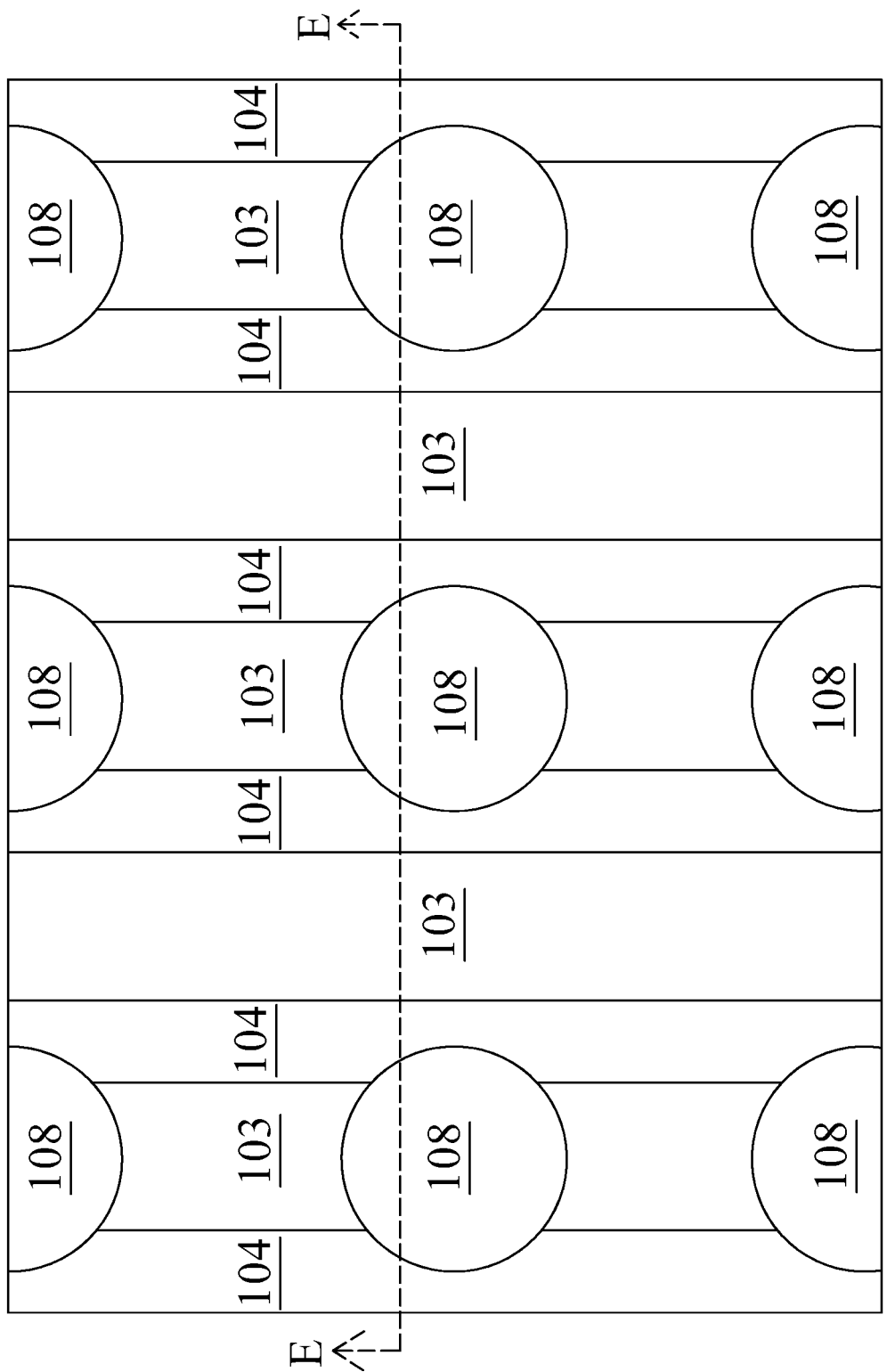

Referring to FIGS. 16 and 17, a sacrificial pillar 108 is disposed over the second dielectric layer 103 according to step S205 in FIG. 3. FIG. 17 is a top view of FIG. 16. FIG. 16 is the cross-sectional side view along a line EE in FIG. 17. The sacrificial pillar 108 is formed by deposition or any other suitable process. In some embodiments, the sacrificial pillar 108 is in contact with the isolation member 104 and the second dielectric layer 103. In some embodiments, the sacrificial pillar 108 includes nitride. In some embodiments, a cross-section of the sacrificial pillar 108 is in a circular shape.

Figure 18:
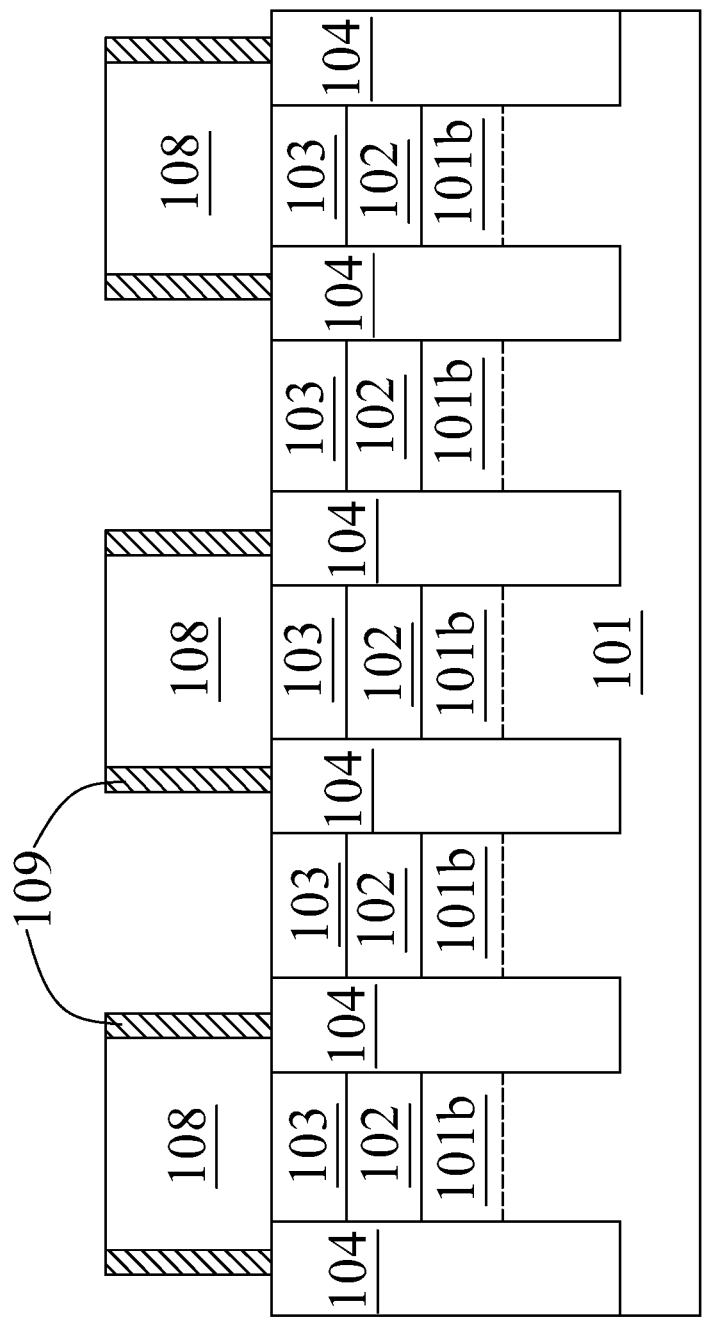
Figure 19:
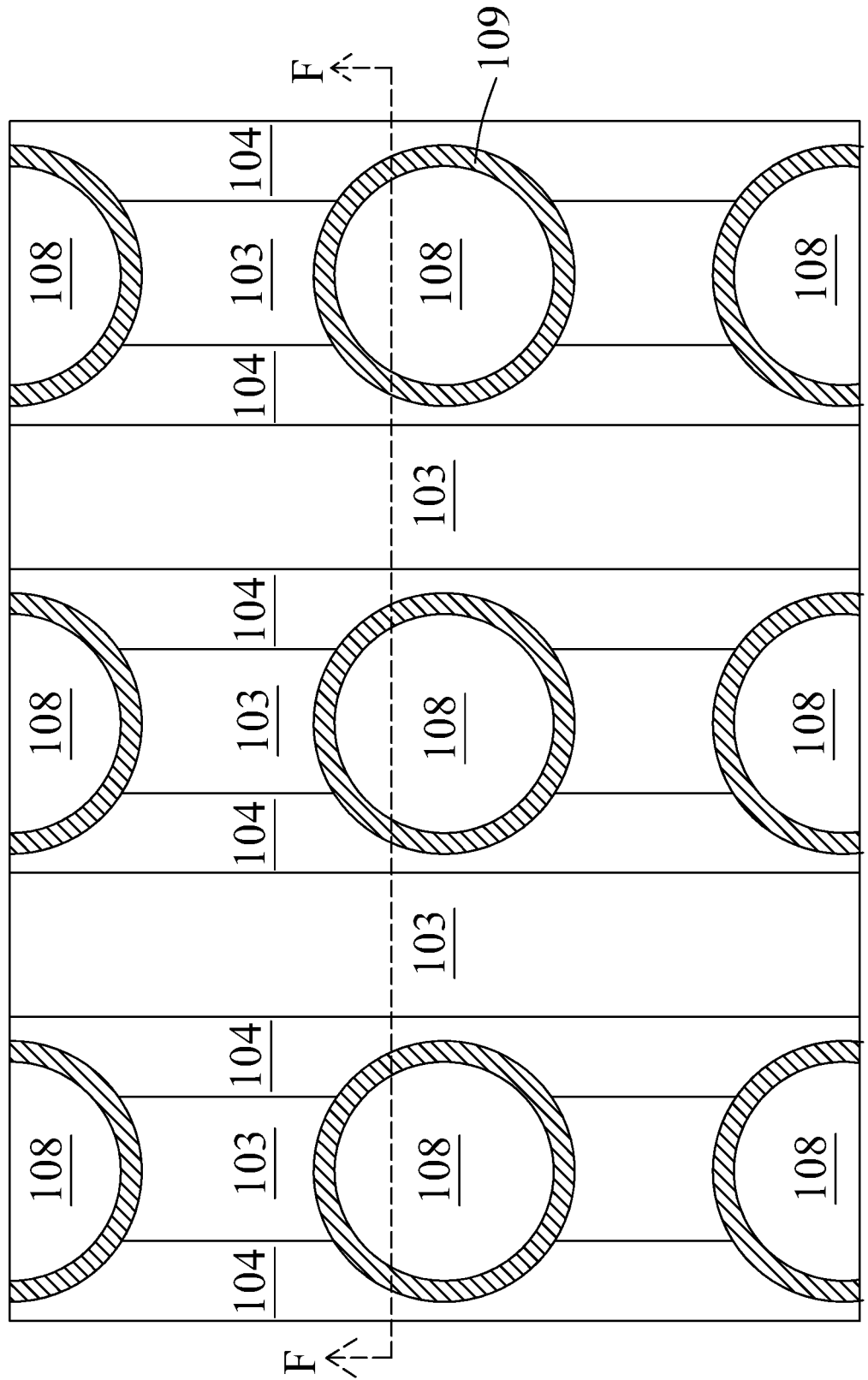

Referring to FIGS. 18 and 19, a first spacer 109 surrounding the sacrificial pillar 108 is disposed according to step S206 in FIG. 3. FIG. 19 is a top view of FIG. 18. FIG. 18 is the cross-sectional side view along a line FF in FIG. 19. The first spacer 109 is formed over the isolation member 104 and the second dielectric layer 103. In some embodiments, the sacrificial pillar 108 is surrounded by the first spacer 109. In some embodiments, the first spacer 109 is in contact with an entire outer surface of the sacrificial pillar 108. In some embodiments, the first spacer 109 is hollow. In some embodiments, the sacrificial pillar 108 is formed over the second dielectric layer 103 prior to the formation of the first spacer 109. In some embodiments, the first spacer 109 includes dielectric material such as oxide, nitride, oxynitride or the like.

Figure 20:
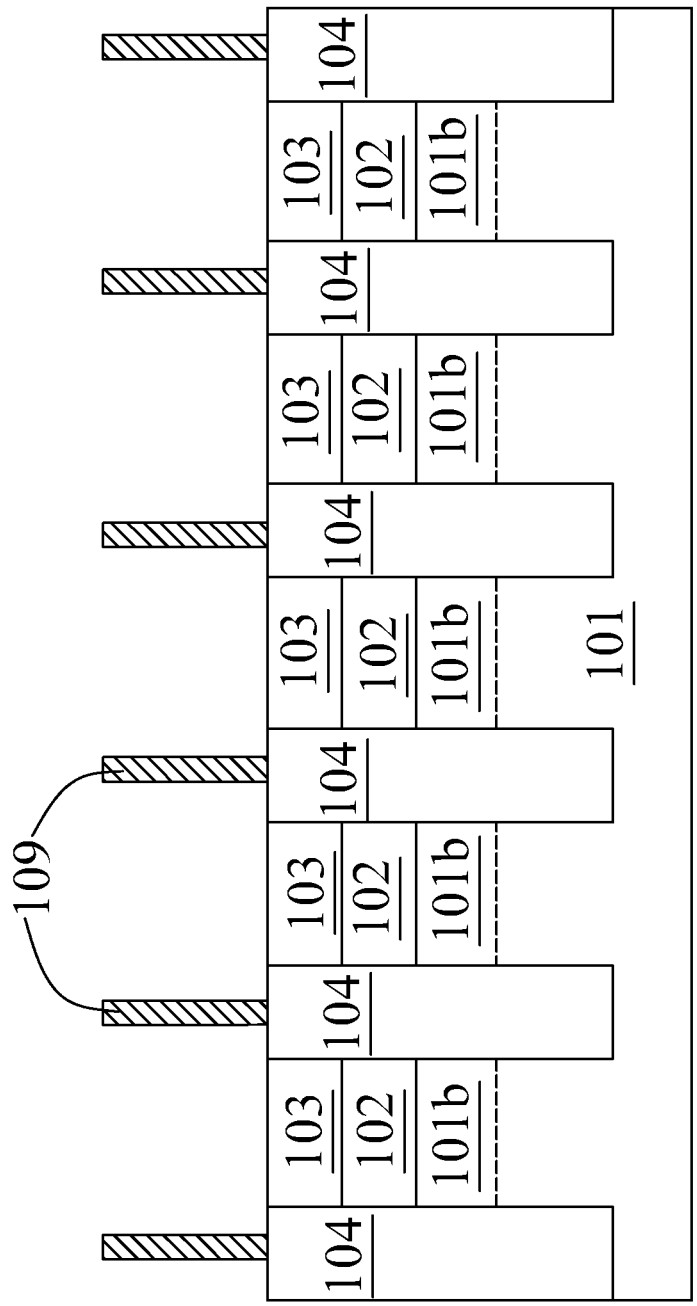
Figure 21:
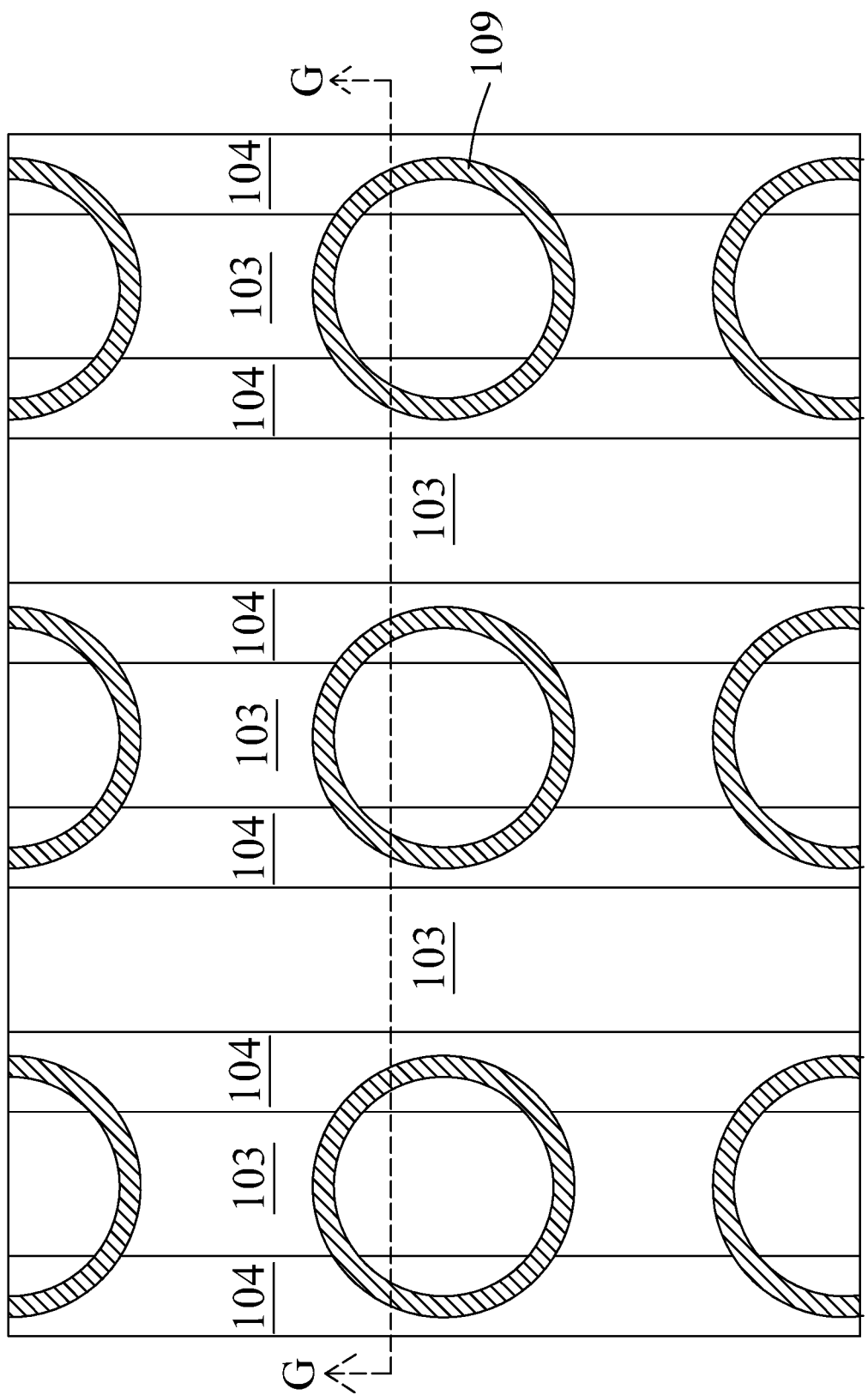

Referring to FIGS. 20 and 21, the sacrificial pillar 108 is removed according to step S207 in FIG. 3. FIG. 21 is a top view of FIG. 20. FIG. 20 is the cross-sectional side view along a line GG in FIG. 21. In some embodiments, the sacrificial pillar 108 is removed by etching or any other suitable process. In some embodiments, the sacrificial pillar 108 is removed after the formation of the first spacer 109.

Figure 22:
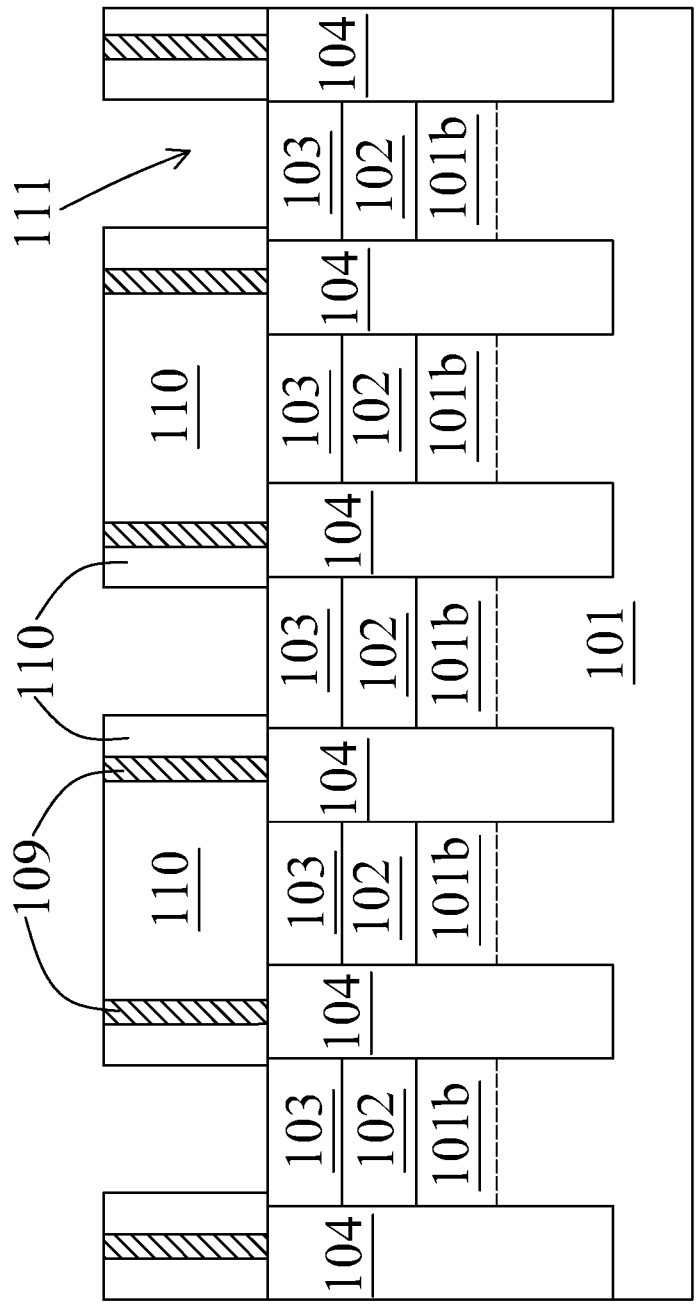
Figure 23:
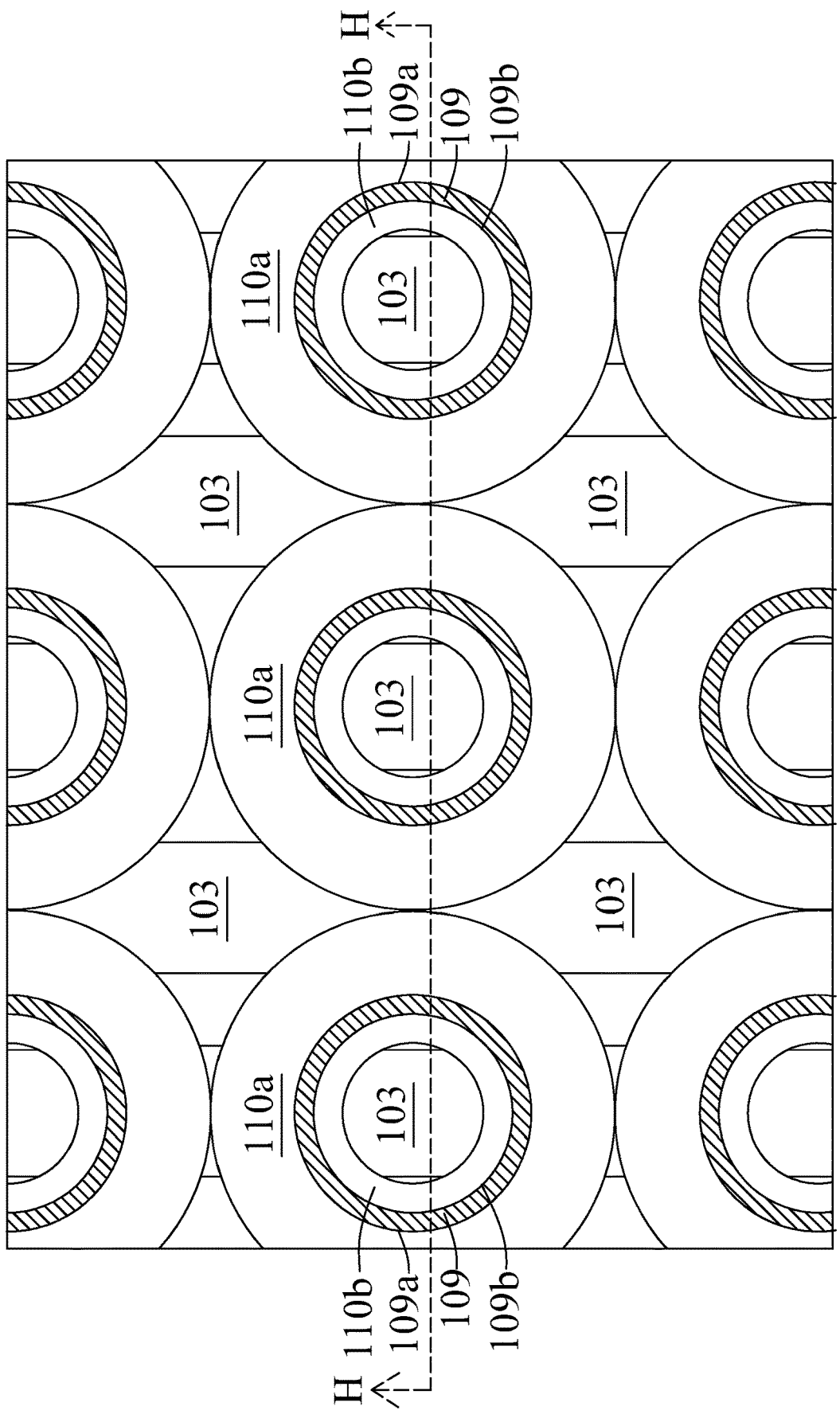

Referring to FIGS. 22 and 23, a second spacer 110 surrounding the first spacer 109 is disposed according to step S208 in FIG. 3. FIG. 23 is a top view of FIG. 22. FIG. 22 is the cross-sectional side view along a line HH in FIG. 23. In some embodiments, the second spacer 110 is formed by deposition or any other suitable process. In some embodiments, the sacrificial pillar 108 is removed prior to the disposing of the second spacer 110. In some embodiments, the first spacer 109 and the second spacer 110 include a same dielectric material. In some embodiments, the first spacer 109 and the second spacer 110 include dielectric material such as oxide, nitride, oxynitride or the like.

In some embodiments, the second spacer 110 is disposed by forming a first annular member 110a in contact with an outer surface 109a of the first spacer 109 and forming a second annular member 110b in contact with an inner surface 109b of the first spacer 109. In some embodiments, the first annular member 110a is a second hollow spacer, and the second annular member 110b is a third hollow spacer. In some embodiments, the first annular member 110a surrounds the first spacer 109, and the second annular member 110b is surrounded by the first spacer 109. The first annular member 110a surrounds the first spacer 109 and the second annular member 110b. In some embodiments, the formation of the first annular member 110a and the formation of the second annular member 110b are performed separately or simultaneously.

In some embodiments, the disposing of the second spacer 110 includes forming an opening 111 surrounded by the first spacer 109 and the second spacer 110. After the disposing of the second spacer 110, at least a portion of the second dielectric layer 103 is exposed through the second spacer 110 and are disposed within the opening 111 from a top view as shown in FIG. 23.

Figure 24:
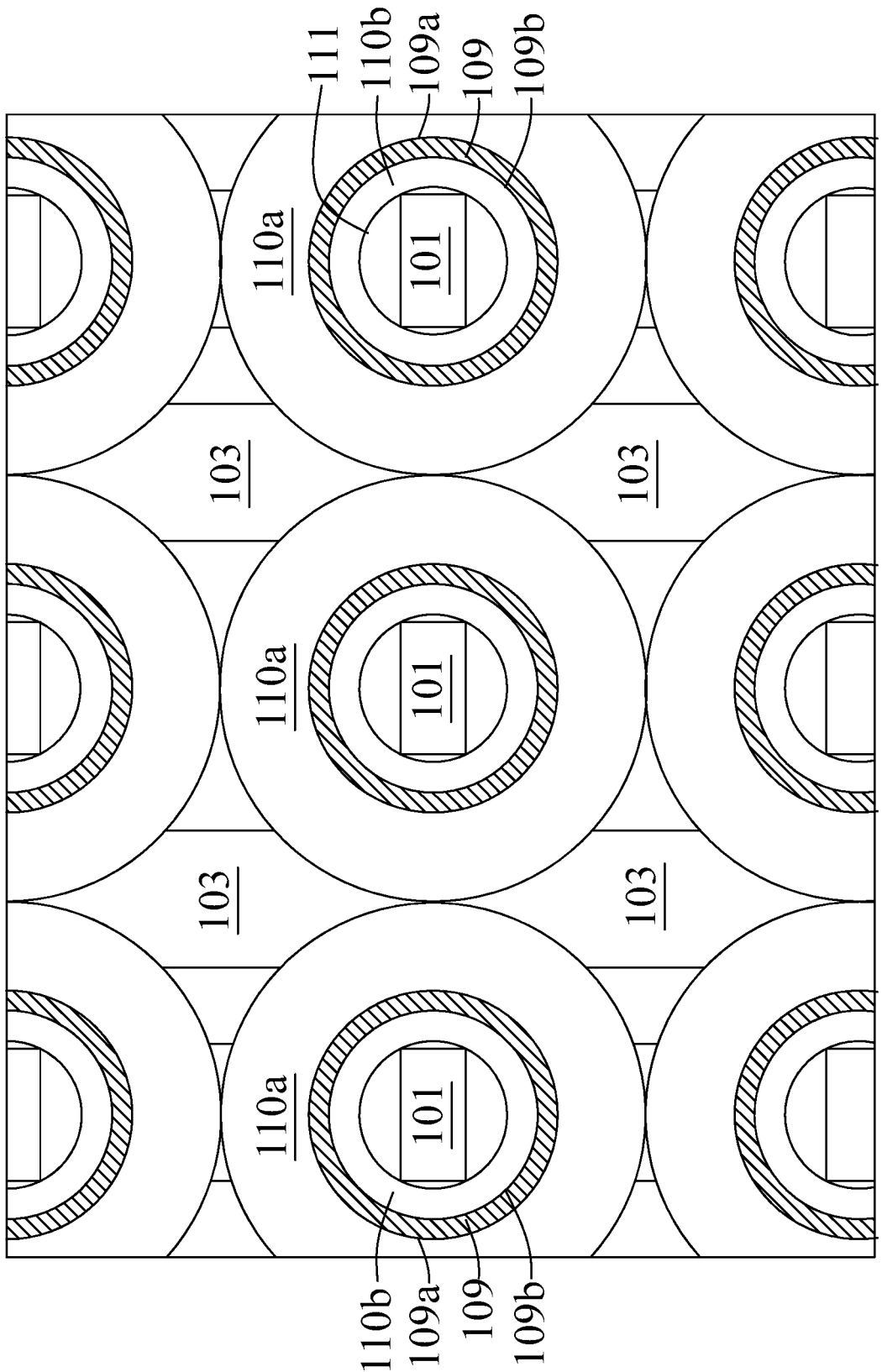
Figure 25:
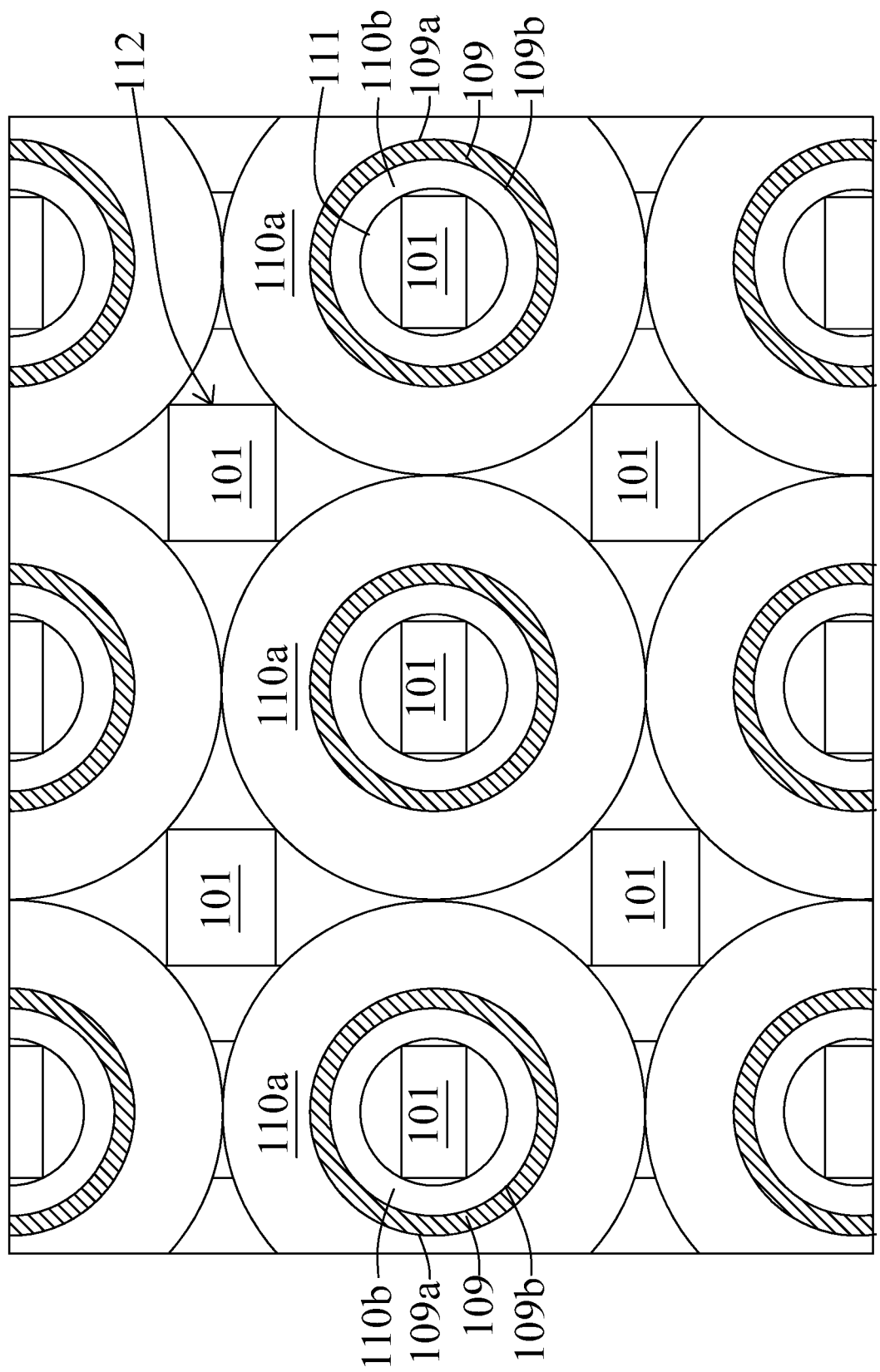

Referring to FIGS. 24 and 25, second portions of the first dielectric layer 102 and the second dielectric layer 103 exposed through the second spacer 110 are removed according to step S209 in FIG. 3. FIG. 24 is a top view illustrating the removal of portions of the first dielectric layer 102 and the second dielectric layer 103 that are exposed through the second spacer 110 and surrounded by the second annular member 110b from the top view, and FIG. 25 is a top view illustrating the removal of portions of the first dielectric layer 102 and the second dielectric layer 103 that are exposed through the second spacer 110 and outside the first annular member 110a from the top view.

In some embodiments, the removal of the second portions of the first dielectric layer 102 and the second dielectric layer 103 exposed through the second spacer 110 includes removing the portions of the first dielectric layer 102 and the second dielectric layer 103 that are within the second spacer 110 from the top view as shown in FIG. 24, and removing the portions of the first dielectric layer 102 and the second dielectric layer 103 that are outside the second spacer 110 from the top view as shown in FIG. 25.

In some embodiments, the removal of the portions of the first dielectric layer 102 and the second dielectric layer 103 that are within the second spacer 110 from the top view as shown in FIG. 24 is performed before or after the removal of the portions of the first dielectric layer 102 and the second dielectric layer 103 that are outside the second spacer from the top view as shown in FIG. 25. In some embodiments, the removal of the portions of the first dielectric layer 102 and the second dielectric layer 103 that are within the second spacer 110 from the top view as shown in FIG. 24 is performed simultaneously with the removal of the portions of the first dielectric layer 102 and the second dielectric layer 103 that are outside the second spacer from the top view as shown in FIG. 25.

In some embodiments, after the removal of the portions of the first dielectric layer 102 and the second dielectric layer 103 that are within the second spacer 110 from the top view as shown in FIG. 24 is performed before or after the removal of the portions of the first dielectric layer 102 and the second dielectric layer 103 that are outside the second spacer from the top view as shown in FIG. 25, at least a portion of the semiconductor substrate 101 is exposed through the second dielectric layer 103 as shown in FIG. 25.

Figure 26:
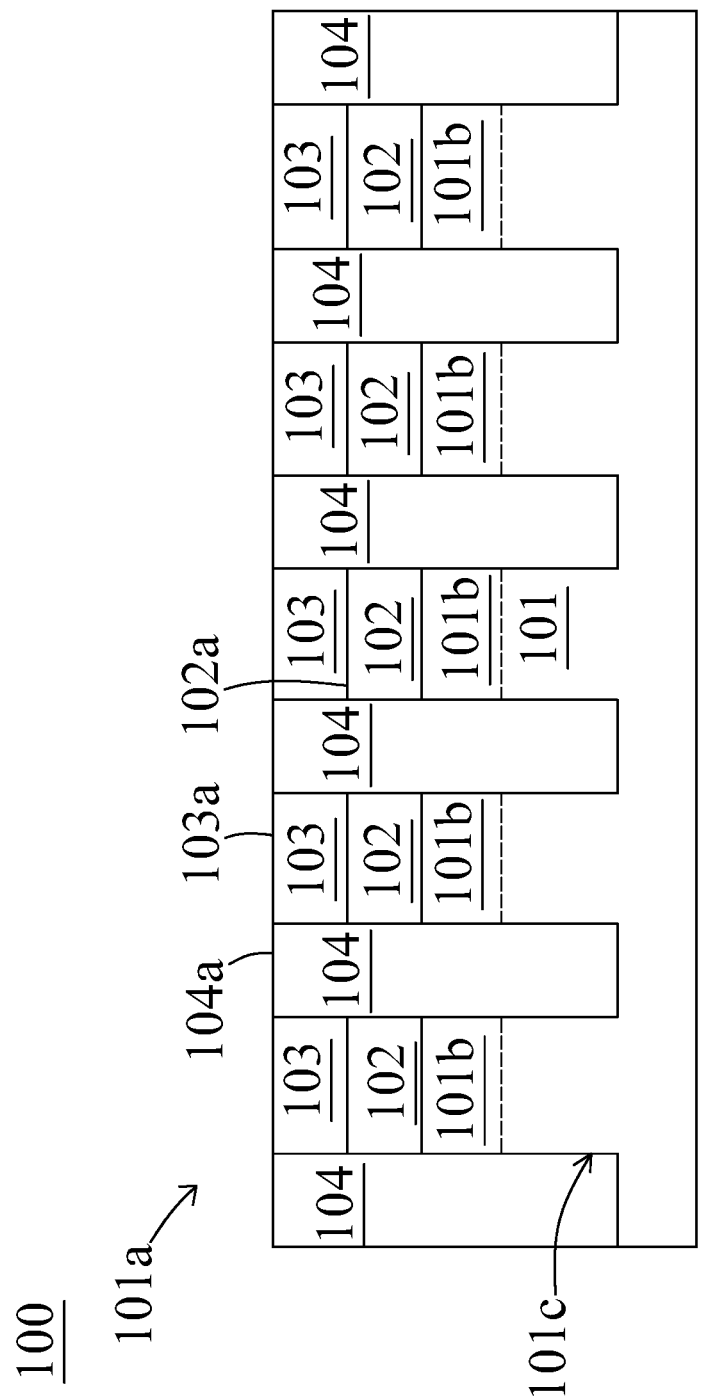
Figure 27:
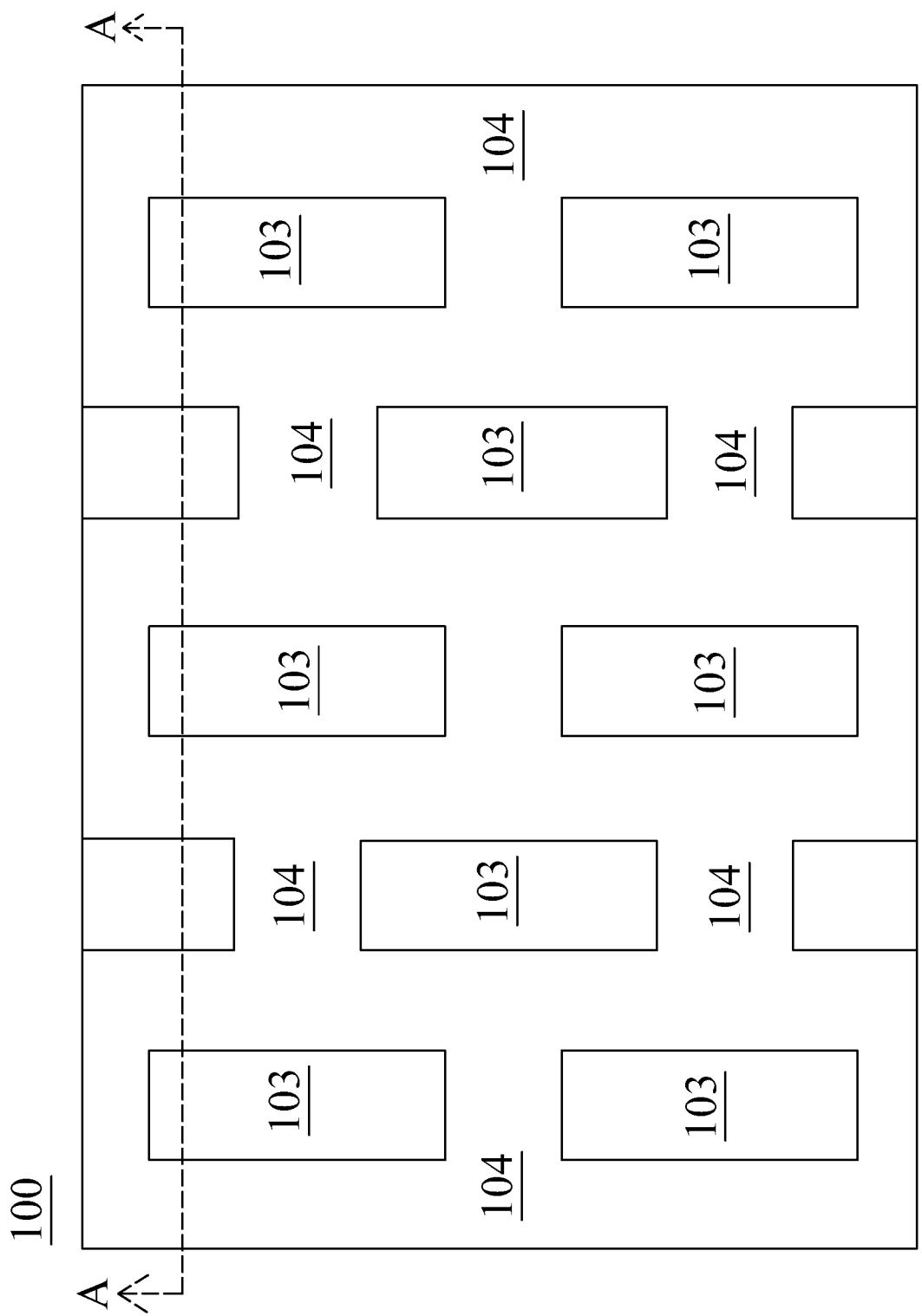

In some embodiments, after the removal of the second portions of the first dielectric layer 102 and the second dielectric layer 103 exposed through the second spacer 110, the first spacer 109 and the second spacer 110 are removed as shown in FIGS. 26 and 27. FIG. 27 is a top view of FIG. 26. In some embodiments, the first spacer 109 and the second spacer 110 are removed by etching, stripping or any other suitable process. In some embodiments, the removal of the first spacer 109 and the removal of the second spacer 110 are performed separately or simultaneously. In some embodiments, the removal of the first spacer 109 is performed before or after the removal of the second spacer 110.

In some embodiments, the portion of the semiconductor substrate 101 exposed through the second dielectric layer 103 as shown in FIG. 25 is removed, and then the isolation member 104 is also disposed in the hole 112 as shown in FIG. 27. In some embodiments, the isolation member 104 fills the hole 112. In some embodiments, the removal of the portion of the semiconductor substrate 101 exposed through the second dielectric layer 103 is performed before or after the removal of the first spacer 109 and the removal of the second spacer 110. In some embodiments, a memory device 100 as shown in FIGS. 1 and 2 is formed as shown in FIGS. 26 and 27.

In some embodiments, the second dielectric layer 103 is removed after the filling of the hole 112 by the isolation member 104. In some embodiments, after the removal of the second dielectric layer 103, the isolation member 104 and the first dielectric layer 102 are planarized. In some embodiments, after the planarization, implantation of dopants over the active area 101b is performed.

In an aspect of the present disclosure, a method of manufacturing a memory device is provided. The method includes steps of providing a semiconductor substrate including an active area disposed over or in the semiconductor substrate, a first dielectric layer over the semiconductor substrate, a second dielectric layer over the first dielectric layer, and a patterned photoresist layer over the second dielectric layer; removing first portions of the semiconductor substrate, the first dielectric layer and the second dielectric layer exposed through the patterned photoresist layer to form a trench; removing the patterned photoresist layer; disposing an isolation member within the trench; disposing a sacrificial pillar over the second dielectric layer; disposing a first spacer surrounding the sacrificial pillar; removing the sacrificial pillar; disposing a second spacer surrounding the first spacer; and removing second portions of the first dielectric layer and the second dielectric layer exposed through the second spacer.

In another aspect of the present disclosure, a method of manufacturing a memory device is provided. The method includes steps of providing a semiconductor substrate including an active area disposed over or in the semiconductor substrate; forming an oxide film over the semiconductor substrate; forming a nitride film over the oxide film; form a trench extending through the oxide film and the nitride film; forming a first hollow spacer over the nitride film; forming a second hollow spacer surrounding the first hollow spacer; forming a third hollow spacer surrounded by the first hollow spacer; and removing portions of the oxide film and the nitride film exposed through the second hollow spacer and the third hollow spacer.

In another aspect of the present disclosure, a memory device is provided. The memory device includes a semiconductor substrate defined with an active area over or in the semiconductor substrate and including a recess surrounding the active area; a first dielectric layer disposed over the active area of the semiconductor substrate; a second dielectric layer disposed over the first dielectric layer; and an isolation member disposed within the recess and entirely surrounding the active area.

In conclusion, because the active area of the semiconductor substrate is defined by disposing several annular spacers over the semiconductor substrate and removing predetermined portions of the semiconductor substrate exposed through the annular spacers, a size of the active area can be maintained with minimal or no decrease during the removal. Therefore, a process window for subsequent processes over the active area is not further reduced. As a result, misalignment or leakage among the memory cells in the memory device can be prevented or minimized, and an overall performance the memory device can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a semiconductor device including an active area in a strip, comprising:
    providing a semiconductor substrate including the active area disposed in the semiconductor substrate, a first dielectric layer over the semiconductor substrate, a second dielectric layer over the first dielectric layer, and a patterned photoresist layer over the second dielectric layer;
    removing first portions of the semiconductor substrate, the first dielectric layer and the second dielectric layer exposed through the patterned photoresist layer to form a trench surrounded by second portions of the first dielectric layer and the second dielectric layer;
    removing the patterned photoresist layer;
    disposing an isolation material over the semiconductor substrate and the second portion of the second dielectric layer;
    removing top portions of the isolation material to form an isolation member within the trench;
    disposing a sacrificial pillar over the second portion of the second dielectric layer and a portion of the isolation member;
    disposing a first circular spacer over the isolation member and the second portion of the second dielectric layer to contact with and surround an outer surface of the sacrificial pillar;
    removing the sacrificial pillar;
    disposing a second circular spacer over the isolation member and the second portion of the second dielectric layer to contact with an outer surface and an inner surface of the first circular spacer, and forming an opening surrounded by the first circular spacer and the second circular spacer to expose the second portions of the first dielectric layer and the second dielectric layer; and
    removing the second portions of the first dielectric layer and the second dielectric layer exposed from the opening.

2. The method according to claim 1, further comprising removing the first spacer and the second spacer after the removal of the second portions of the first dielectric layer and the second dielectric layer exposed through the second spacer.

3. The method according to claim 1, wherein the sacrificial pillar is removed after the disposing of the first spacer and prior to the disposing of the second spacer.

4. The method according to claim 1, further comprising removing third portions of the semiconductor substrate exposed through the second spacer, the first dielectric layer and the second dielectric layer.

5. The method according to claim 1, wherein the sacrificial pillar includes nitride.

6. The method according to claim 1, wherein a cross-section of the sacrificial pillar is in a circular shape.

7. The method according to claim 1, wherein the first spacer and the second spacer include a same dielectric material.

8. The method according to claim 1, wherein the removal of the second portions of the first dielectric layer and the second dielectric layer exposed through the second spacer includes removing fourth portions of the first dielectric layer and the second dielectric layer that are within the second spacer from a top view, and removing fifth portions of the first dielectric layer and the second dielectric layer that are outside of the second spacer from the top view.

9. The method according to claim 8, wherein the removal of the fourth portions of the first dielectric layer and the second dielectric layer that are within the second spacer from the top view is performed before or after the removal of the fifth portions of the first dielectric layer and the second dielectric layer that are outside of the second spacer from the top view.

10. The method according to claim 8, wherein the removal of the fourth portions of the first dielectric layer and the second dielectric layer that are within the second spacer from the top view is performed simultaneously with the removal of the fifth portions of the first dielectric layer and the second dielectric layer that are outside of the second spacer from the top view.

11. The method according to claim 1, wherein the disposing of the second spacer includes forming an opening surrounded by the first spacer and the second spacer.

12. The method according to claim 11, wherein the second portions of the first dielectric layer and the second dielectric layer exposed through the second spacer is at least partially disposed within the opening from the top view.

13. The method according to claim 1, wherein the second spacer includes a first annular member in contact with an outer surface of the first spacer, and includes a second annular member in contact with an inner surface of the first spacer.

14. The method according to claim 1, wherein the first dielectric layer includes oxide.

15. The method according to claim 1, wherein the second dielectric layer includes nitride.

16. The method according to claim 1, wherein the isolation member includes oxide.

* * * * *